United States Patent
Keskar et al.

(10) Patent No.: US 7,902,807 B2
(45) Date of Patent: Mar. 8, 2011

(54) MULTIPLE SWITCH NODE POWER CONVERTER CONTROL SCHEME THAT AVOIDS SWITCHING SUB-HARMONICS

(75) Inventors: Neeraj Arun Keskar, Merrimack, NH (US); Peter James Miller, Manchester, NH (US)

(73) Assignee: Texas Instruments Incorporated, Dallas, TX (US)

( * ) Notice: Subject to any disclaimer, the term of this patent is extended or adjusted under 35 U.S.C. 154(b) by 420 days.

(21) Appl. No.: 12/220,239

(22) Filed: Jul. 22, 2008

(65) Prior Publication Data
US 2010/0019745 A1    Jan. 28, 2010

(51) Int. Cl.
*G05F 1/40*    (2006.01)
*G05F 1/24*    (2006.01)
(52) U.S. Cl. .................. 323/288; 323/259; 323/271
(58) Field of Classification Search .............. 323/259, 323/271, 282–285, 288
See application file for complete search history.

(56) References Cited

U.S. PATENT DOCUMENTS

| | | | |
|---|---|---|---|
| 6,384,652 B1 * | 5/2002 | Shu | 327/175 |
| 7,479,769 B2 * | 1/2009 | Xu | 323/271 |
| 7,652,453 B2 * | 1/2010 | Iulian | 323/259 |
| 7,656,142 B2 * | 2/2010 | Liao | 323/288 |

* cited by examiner

*Primary Examiner* — Jessica Han
(74) *Attorney, Agent, or Firm* — William B. Kempler; Wade J. Brady, III; Frederick J. Telecky, Jr.

(57) ABSTRACT

A method of and system for modulating buck and boost modulation ramps of a multiple switch node power converter without overlap. As the pulse width or duty cycle of the signal to a modulated complementary switching pair approaches a pre-established reference pulse width or duty cycle, plural fixed-width or fixed duty cycle pulses are generated and introduced to a nonmodulated complementary switching pair. A controller detects proximity to the pulse width or duty cycle limit and, correspondingly, initiates prematurely a pseudo-buck-boost mode in the power converter by generating fixed-width or fixed duty cycle pulses to the nonmodulated complementary switching pair while the duty cycles or pulse widths to the modulated complementary switching pair are still controlled by the appropriate modulation ramp. The net effect is that the power converter reaches its optimal operating point without overlap and eliminates any sub-harmonic switching.

36 Claims, 13 Drawing Sheets

MULTIPLE SWITCH NODE POWER CONVERTER CONTROL SCHEME THAT AVOIDS SWITCHING SUB-HARMONICS

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention concerns multiple switch node power converters and, more particularly, to a method of and system for controlling the switching devices of multiple switch node power converters by modulating a single error voltage or current signal using only one of the modulation ramps at any given time.

Referring to FIGS. 1A, 1B, and 1C, a non-inverting, multiple switch node, four-switch buck-boost power converter 10 is shown. The buck-boost power converter 10 is structured and arranged to generate an output voltage, $V_O$, that can be higher than, lower than, or equal to the input voltage, $V_{IN}$. When the output voltage, $V_O$, is greater than the input voltage $V_{IN}$, the power converter 10 operates in boost mode 12, whereas when the input voltage, $V_{IN}$, is greater than the output voltage, $V_O$, the power converter 10 operates in buck mode 14. FIG. 1B and FIG. 1C show buck mode 14 and boost mode 12, respectively.

Conventionally, multiple switch node power converters 10 can be controlled to provide pure buck power conversion or to provide pure boost power conversion by adjusting or modulating the duty cycles, e.g., the ON and OFF pulse widths, of gate pulses to complementary switching devices disposed at each switch node. Switch node SW1, which includes complementary switching devices ("switches") S1 and S2, and switch node SW2, which includes complementary switches S3 and S4, are disposed on either side of the inductor 15. During buck mode, complementary switches S1 and S2 at switch node SW1 become the "modulated" switches because their duty cycles or pulse widths are modulated as necessary, while switch S4 is a "nonmodulated" switch whose duty cycle is 100 percent or substantially 100 percent and switch S3 is a "nonmodulated" switch whose duty cycle is 0 percent or substantially 0 percent. Duty cycle for buck mode is defined as the ratio of the ON-time of switch S1 to the period of the entire switching cycle.

During buck mode, the voltage at the nonmodulated switch node SW2 is held constant, approximately equal to the output voltage, $V_O$, while the voltage on switches S1 and S2 varies between approximately the input voltage, $V_{IN}$, and ground. Referring to FIG. 1B, nonmodulated switch S3 is open (OFF) and nonmodulated switch S4 is closed (ON) during the entire switching cycle and the duty cycles or pulse widths of modulated complementary switches S1 and S2 are controlled to realize pure buck mode power conversion.

Conversely, during boost mode, complementary switches S3 and S4 at switch node SW2 become the "modulated" switches whose duty cycles or pulse widths are modulated as necessary. Switch S1 is the "nonmodulated" switch whose duty cycle is 100 percent or substantially 100 percent. Switch S2 is the "nonmodulated" switch whose duty cycle is 0 percent or substantially 0 percent. Duty cycle in boost mode is defined as the ratio of the ON-time of switch S3 to the period of the entire switching cycle.

In boost mode, the voltage at switch node SW1 is held constant, approximately equal to the input voltage, $V_{IN}$, while the voltage on switches S3 and S4 varies between approximately the output line voltage, $V_O$, and ground. Referring to FIG. 1C, with nonmodulated switch S2 open (OFF) and nonmodulated switch S1 closed (ON) during the entire switching cycle, the duty cycles or pulse widths of modulated complementary switches S3 and S4 can be controlled to realize pure boost mode power conversion.

During buck-boost mode, necessarily, all four switches S1-S4 are switched during the switching cycle. Ideally, two switches are always closed and two switches are always open during the switching cycle. During buck-boost mode, complementary switching pair S1 and S2 and complementary switching pair S3 and S4, however, are never simultaneously closed or simultaneously open.

Typically, the circuit operates in the buck-boost mode when the input voltage, $V_{IN}$, and the output voltage, $V_O$, are equal or substantially equal in magnitude. When this occurs and when switch S1 and switch S4 are closed simultaneously and/or when switch S2 and switch S3 are closed simultaneously, the voltage across the inductor 15 is zero or substantially zero. Thus, the inductor 15 is energized by the input voltage, $V_{IN}$, which is to say, that the inductor current, $i_L$, increases, only when switch S1 and switch S3 are closed and the inductor 15 is de-energized, which is to say that the inductor current, $i_L$, decreases, only when switch S2 and switch S4 are closed.

Problematically, to reduce inductor current ripple—and, eventually, to reduce output voltage ripple—the overlapping ON duty cycle times of non-complementary switching pair S1 and S3 and of non-complementary switching pair S2 and S4 must be kept small while the inductor 15 is, respectively, energizing and de-energizing. Reducing inductor current ripple is desirable because, inter alia, it reduces associated ripple conduction power loss that is dissipated in the parasitic series resistances, e.g., due to switch ON-resistance, inductor ESR, and so forth, and it improves efficiency.

Referring to FIG. 2, the operation of a conventional multiple switch node, buck-boost power converter 20 will be described. At the output, the output voltage, $V_O$, is sensed and scaled, $V_S$, and fed back to an error amplifier 21. The sensed voltage, $V_S$, is compared to a predetermined reference voltage, $V_{REF}$, e.g., using the voltage error amplifier 21 or a transconductance amplifier. Based on the comparison, the voltage error amplifier 21 generates a voltage error signal, $V_{ERR}$, which is introduced as input into a pair of controllers 26 and 28. Optionally, the voltage error signal, $V_{ERR}$, can be reduced by the voltage corresponding to a sensed inductor current, $i_L R_I$, to generate a final voltage error signal, $V_{ERR} - i_L R_I$.

Those of ordinary skill in the art can appreciate that, alternatively, the error amplifier could be a current error amplifier that generates a current error signal to achieve the same results. For simplicity and not for purposes of limitation, the invention will be described using voltages rather than currents.

One controller 26, e.g., buck pulse width modulation (PWM) comparator ($C_{Buck}$), compares the voltage error signal, $V_{ERR}$ or $V_{ERR} - i_L R_I$, with a buck modulation/slope-compensation ramp $V_{Buck}$. The other controller 28, e.g., boost pulse width modulation (PWM) comparator ($C_{Boost}$), compares the voltage error signal, $V_{ERR}$ or $V_{ERR} - i_L R_I$, with a boost modulation/slope-compensation ramp $V_{Boost}$. Based on the results of the corresponding comparison, each of the PWM comparators 26 and 28 is adapted to generate gate-driving signals to gate drivers 23 and 27. The gate drivers 23 and 27 drive, i.e., turn ON or OFF, complementary switching pair S1 and S2 and complementary switching pair S3 and S4, respectively.

Referring to FIG. 3, a $V_{Boost}$ modulation ramp 32 is shown superimposed and level-shifted with respect to a $V_{Buck}$ modulation ramp 34. Ideally, for peak efficiency, the buck modulation ramp 34 and boost modulation ramp 32 should meet at plural points of intersection 39 without any overlap. If this ideal case ever occurs, the maximum buck duty cycle, i.e., at the acme 36 of the buck modulation ramp 34, extends to 100% or substantially 100%, and the minimum boost duty cycle, i.e., at the bottom 38 of the boost modulation ramp 32, is zero or substantially zero. In this ideal case, the power converter can operate in pure buck mode and in pure boost mode, but there is no transitional, buck-boost mode.

In practice, however, the ideal case rarely occurs. Indeed, due to circuit delays resulting from, for example, switching events, comparator delays, and the like, the ideal case generally does not occur. As a result, maximum and minimum duty cycles or pulse widths for the buck and boost modes never reach their ideal limits. Instead and as a result, a transitional, buck-boost mode occurs, which can be problematic.

Referring again to FIG. 3, a horizontal line corresponding to the direct current (DC) level 35 of the final voltage error signal, $V_{ERR}-i_L R_I$, is shown. As the input voltage, $V_{IN}$, decreases, under the influence of the error amplifier and/or the current signal, $i_L R_I$, the DC level 35 of the final voltage error signal moves upwards from buck mode to boost mode. As the input voltage, $V_{IN}$, increases, the DC level 35 of the final voltage error signal moves downwards from boost to buck mode. As the DC level 35 of the final voltage error signal moves from the very bottom 31 of the buck modulation ramp 34 to the very top 33 of the boost modulation ramp 32, the power converter 20 mode of operation changes from pure buck mode to pure boost mode. However, as the DC level 35 of the final voltage error signal transitions from near the acme 36 of buck modulation ramp 34 and near the bottom 38 of boost modulation ramp 32, the power converter 20 further transitions through an intermediate buck-boost mode.

For example, if, for the purpose of discussion, we assume that the demanded buck duty cycle required to satisfy the given $V_{IN}/V_O$ ratio is 95% but that the power converter 20 can only deliver a maximum buck duty cycle of 90%, then the energy (power) supplied to the load 29 is less than what is needed to sustain the desired output voltage. In this case, remnant energy to make up the difference caused by the limited buck duty cycle must be provided by the effective boost converter, which is to say, that complementary switching pair S3 and S4, which for pure buck operation are, respectively open (OFF) and closed (ON) for the entire switching cycle, must be switched to generate the necessary remnant power. When complementary switching pair S3 and S4 and complementary switching pair S1 and S2 are both being switched, the power converter is in buck-boost mode.

Moreover, modulating the duty cycles or pulse widths of all four of the switches S1-S4 during the switching cycle can only be achieved when the DC level 35 of the voltage error signal intersects both the boost modulation ramp 32 and the buck modulation ramp 34 at their respective duty cycles. For this to occur, the buck modulation ramp 34 and the boost modulation ramp 32 must include some measure of overlap.

The minimum boost mode duty cycle is also limited. For example, for the purpose of discussion, if we assume that the required boost duty cycle is less than 5% but that the minimum achievable boost duty cycle is only 10%, as a result, even at its lowest possible duty cycle, i.e., 10%, switching of complementary switching pair S3 and S4 delivers surplus energy to the load 29.

The prior art has applied two steady-state solutions to this dilemma. The first involves sub-harmonic switching and the second involves increased ramp overlap. With sub-harmonic switching, ramp overlap stays as it is with complementary switching pair S1 and S2 being modulated at a duty cycle of, for example, 90%, and complementary switching pair S3 and S4 being modulated at a duty cycle of, for example, 10%. The output voltage charges and discharges in response to the surplus energy and energy shortage supplied to the load 29 during the various switching events.

Problematically, with subharmonic switching, the voltage error signal oscillates. Low frequency oscillation causes the DC level 35 of the final voltage error signal to intersect sometimes with just the boost modulation ramp 32, sometimes with just the buck modulation ramp 34, and sometimes with both ramps 32 and 34, such that the average value of the output voltage is in regulation. In terms of the switching activity, however, the system 20 is self-oscillating and the actual switching frequency, which is determined by the load 29, terminal voltages, ramp overlap, and filter values, is a subharmonic of the pre-established switching frequency.

Representative, measured waveforms for a 3-5.5V buck-boost power converter illustrating the above problem are shown in FIG. 4A and FIG. 4B. Referring to the bottom and middle waveforms in FIG. 4A and FIG. 4B, switch node SW1 (bottom waveforms), comprising complementary switching pair S1 and S2, is shown being modulated at approximately one-third of the clock frequency of 1.35 MHz, while switch node SW2 (middle waveforms), comprising complementary switching pair S3 and S4, is shown being modulated at approximately two-thirds of the clock frequency of 1.35 MHz. Other frequency combinations are observed depending upon voltage ratios and loading conditions.

The top waveforms show the resulting ripple 45 from each switching event. Thus, output voltage ripple is demonstrably increased at a frequency of approximately one-third of the clock frequency 1.35 MHz. Although not shown, the inductor current shows similar ripple effects, raising EMI concerns.

Alternatively, another possibility includes pre-defining an optimal operating condition for the power converter 20, which is to say, finding an operating condition at which the complementary switching pair S3 and S4 for boost mode is modulated at approximately 10%, while the complementary switching pair S1 and S2 for buck mode is purposely modulated at a lower duty cycle reduced from 90% (say 80% for discussion purposes). In this instance, the reduced energy resulting from modulation of complementary switching pair S1 and S2 can compensate for the surplus energy resulting from modulation of complementary switching pair S3 and S4.

Advantageously, because the net energy delivered to the output load 29 is equal to the demand, there is no subharmonic switching activity and, moreover, the voltage error signal remains stable. Problematically, to achieve this condition, as shown in FIG. 5A, the buck and boost modulation ramps 34 and 32 must be overlapped so that the DC level 35 of the error voltage signal intersects the buck modulation ramp 34 at the reduced 80% duty cycle level and the boost modulation ramp 32 at the prescribed 10% duty cycle level. This results in an increasing overlap 55. Indeed, in order for the optimal operating point to exist for all design conditions and to account for process/temperature variations, the overlap 55 between ramps 32 and 34 needs to be significantly increased.

As a result, as shown in FIG. 5B, when not at the optimal points of intersection, the power converter 20 will operate in the buck-boost mode 50 with the duty cycles of both complementary switching pairs S1 and S2 and S3 and S4 distant from their maximum and minimum values, respectively. As a result, higher current/voltage ripple and increased power loss can ensue. In addition, the relative positioning and overlap of the modulation ramps 32 and 34 need to be accurately controlled.

Accordingly it would be desirable to provide a method of and a system for controlling a multiple switch node power converter to modulate the duty cycles or pulse widths of complementary switching pairs without having to overlap the buck and boost modulation ramps and to avoid switching sub-harmonics.

SUMMARY OF THE INVENTION

A method of controlling a multiple switch node power converter without overlapping the modulating buck and boost modulation ramps is disclosed. More specifically, as the pulse width or duty cycle of a switching signal to the modulated complementary switching pair approaches a pre-established pulse width or duty cycle limit at time $t_{min}$, plural fixed-width or fixed duty cycle references pulses are generated and introduced to the nonmodulated complementary switching pair. A controller detects proximity to the pulse width or duty cycle limit and, correspondingly, initiates a pseudo-buck-boost mode by generating fixed-width or fixed duty cycle reference pulses to the nonmodulated complementary switching pair, e.g., S3 and S4, in addition to the modulated complementary switching pair, e.g., S1 and S2, pulses, whose pulse widths or duty cycles are still controlled by the corresponding, e.g., buck, modulation ramp.

The introduction of fixed-width or fixed duty cycle pulses to complementary switching pair S3 and S4 generates surplus energy because the duty cycle or pulse-width of complementary switching pair S3 and S4 is now greater than its required value. However, since the voltage error signal is still continuously modulated by the buck modulation ramp, the pulse width modulation feedback loop can compensate for the energy discrepancy, e.g., by decreasing the pulse-width or duty cycle of the buck pulse. The net effect is that the power converter reaches its optimal operating point without overlap and eliminates any subharmonic switching.

DESCRIPTION OF THE DRAWINGS

The invention will be more fully understood by reference to the following Detailed Description of the invention in conjunction with the Drawings, of which.

DETAILED DESCRIPTION OF THE INVENTION

A method of and system for controlling a multiple switch node power converter that avoids switching subharmonics is disclosed. More particularly, a method of and system for controlling a multiple switch node power converter that does not require overlapping the boost and buck modulation ramps during buck-boost mode is disclosed.

Buck-boost power conversion mode occurs when the input voltage, $V_{IN}$, and the output voltage, $V_O$, are equal or substantially equal in magnitude. In contrast with pure buck or pure boost modes in which the complementary switching pair at one switch node are switched ON and OFF during the switching cycle and the complementary switching pair at another switch node are not switched, i.e., either ON or OFF for the entire switching cycle, during buck-boost mode, the complementary switching pair at both switch nodes are switched ON and OFF during some portion of the switching cycle. However, advantageously, according to the present invention, only one of the modulation ramps is used to modulate the voltage error signal.

For the following discussion, the "nonmodulated complementary switching pair" refers to the pair of switches at the switch node SW1 or SW2 whose high-side switch S1 or S4 does not have its gate pulse width controlled by the corresponding modulation ramp and whose gate pulse has a constant width. In extreem e.g., is continuously closed (ON), and whose low-side switch S2 or S3 is continuously open (OFF) during the switching cycle and prior to the generation of reference pulses. The "modulated complementary switching pair" refers to the pair of switches at the switch node SW1 or SW2 whose high-side switch S1 or S4 and whose low-side switch S2 or S3 are modulated according to their corresponding modulation ramp to be both ON and OFF during some portion of the switching cycle. The "modulated signal", therefore, refers to the gate pulse signal that alternately opens and closes the "modulated complementary switching pair". For example, in buck mode, SW1 is the modulated switch node and SW2 is the nonmodulated switch node. Thus, switch S3 and switch S4 become the nonmodulated complementary switching pair and the modulated signal controls modulated complementary switching pair S1 and S2. In boost mode, SW2 is the modulated switch node and SW1 is the nonmodulated switch node. Thus, switch S1 and switch S2 become the nonmodulated complementary switching pair and the modulated signal controls modulated complementary switching pair S3 and S4.

Buck Mode to Buck-Boost Mode of Operation

The function and operation of the system will first be described in connection with a power converter 20 initially in pure buck mode while the input voltage decreases. During pure buck mode power conversion, SW1 is the modulated switch node; SW2 is the nonmodulated switch node; switch S3 (OFF) and switch S4 (ON) are the nonmodulated complementary switching pair and switch S1 and switch S2 are the modulated complementary switching pair.

Figure 1A:
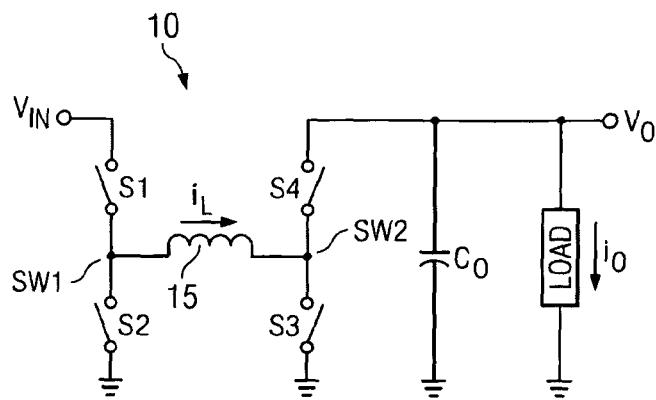
FIG. 1A shows a multiple switch node, four-switch buck-boost power converter in accordance with the prior art.
Figure 1B:
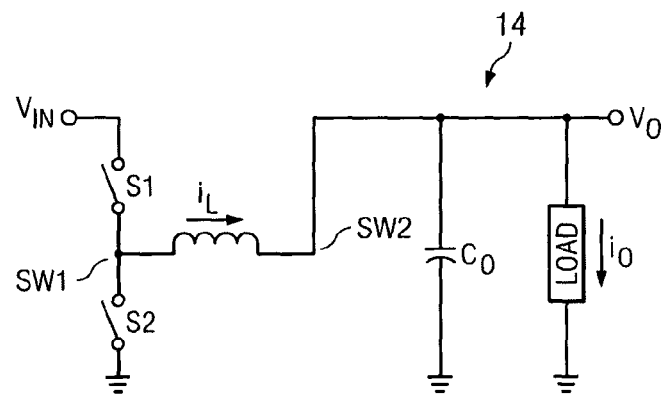
FIG. 1B shows the buck-boost power converter of FIG. 1A operating in buck mode.
Figure 1C:
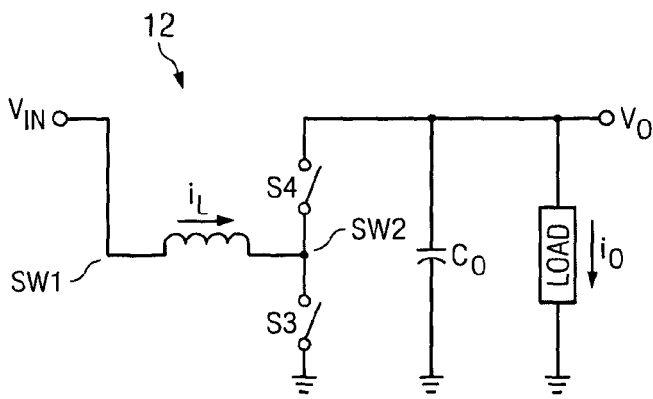
FIG. 1C shows the buck-boost power converter of FIG. 1A operating in boost mode.
Figure 2:
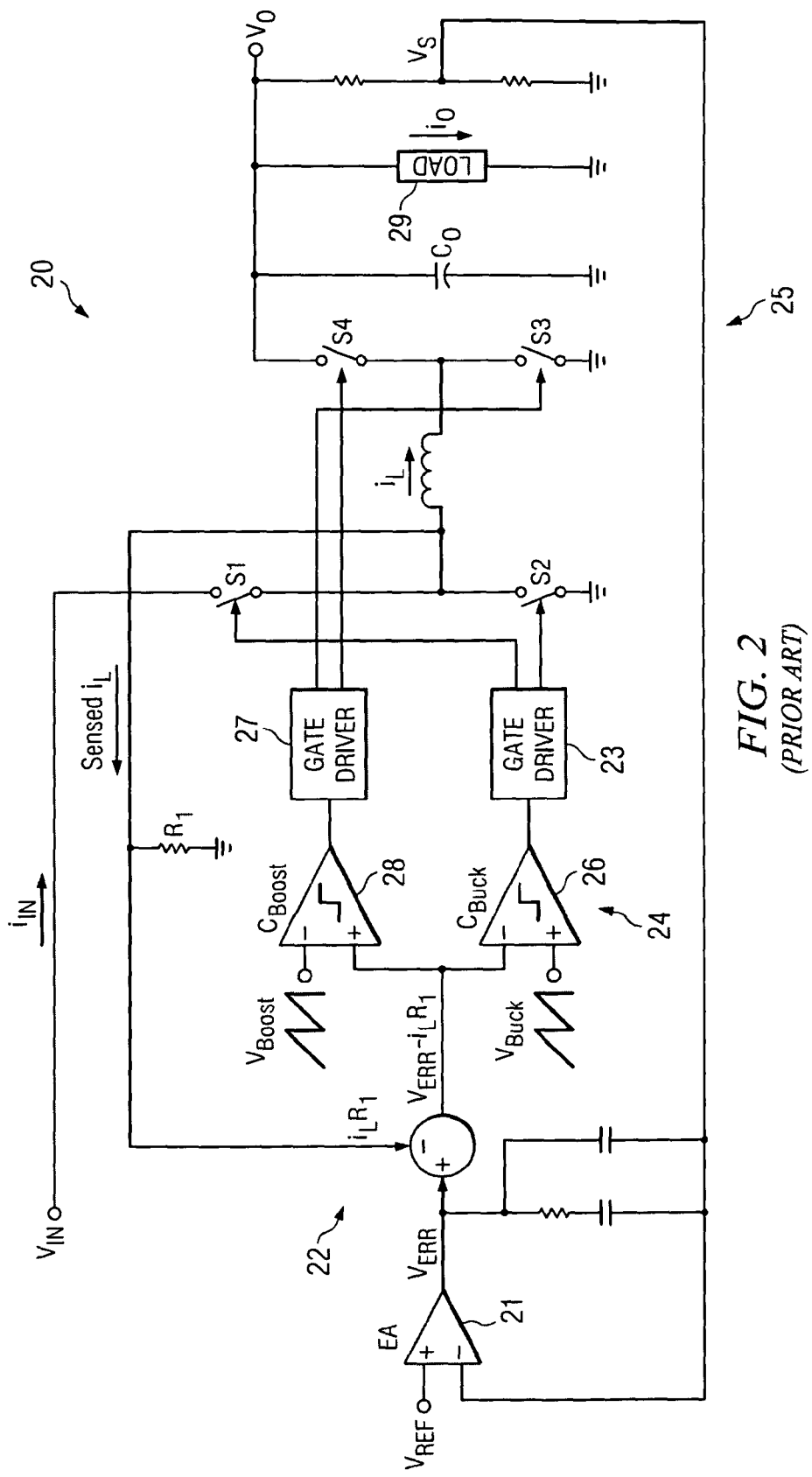
FIG. 2 shows a controller for a multiple switch node, four-switch buck-boost power conversion in accordance with the prior art.
Figure 3:
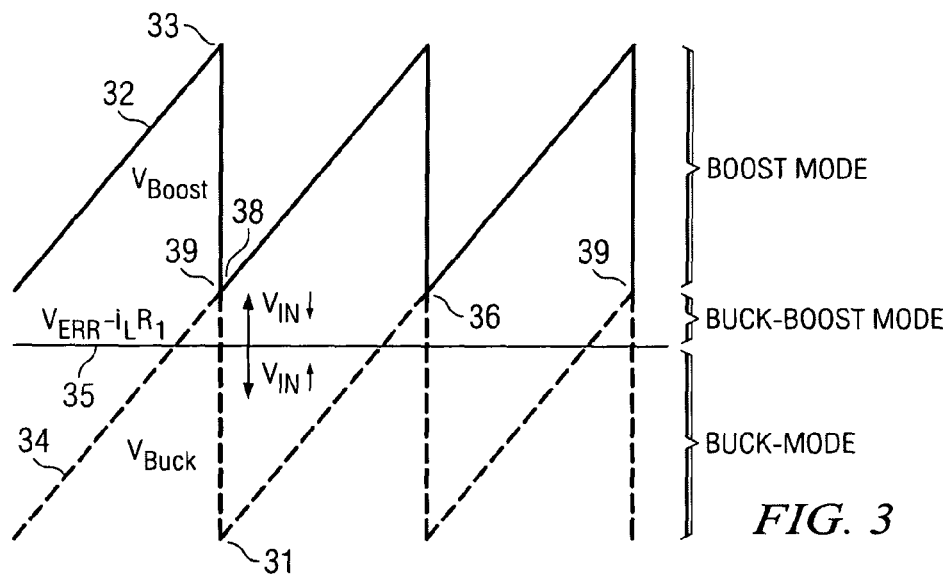
FIG. 3 shows modulating ramps for boost and buck modes.
Figure 4A:
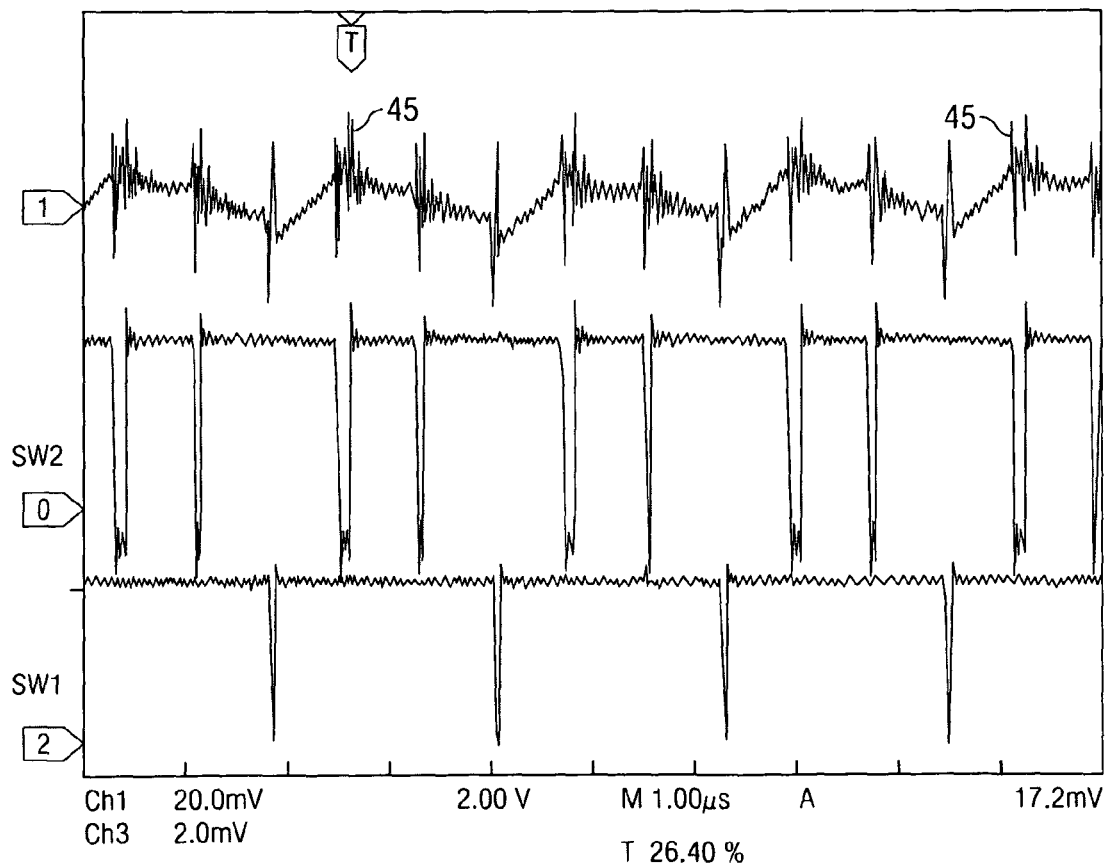
FIG. 4A shows waveforms for switch node SW1 and SW2 and for output current/voltage ripple in accordance with the prior art.
Figure 4B:
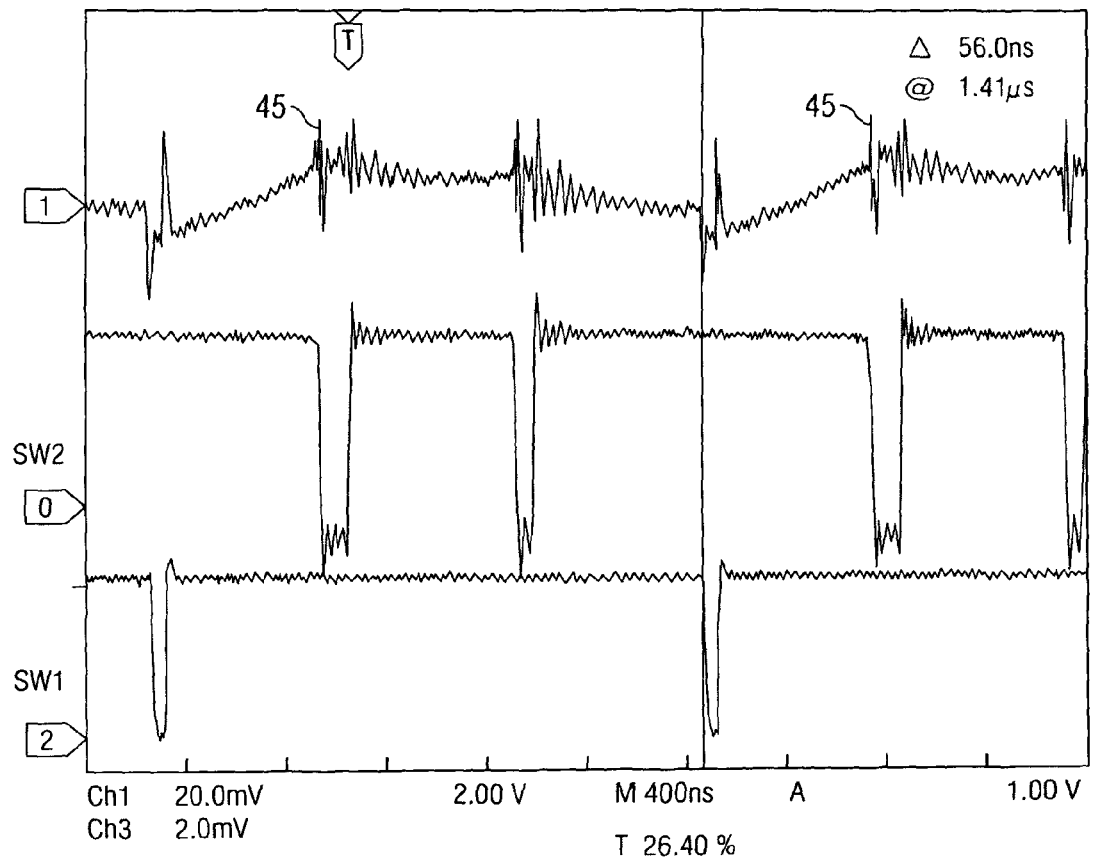
FIG. 4B shows waveforms for switch node SW1 and SW2 and for output current/voltage ripple in accordance with the prior art.
Figure 5A:
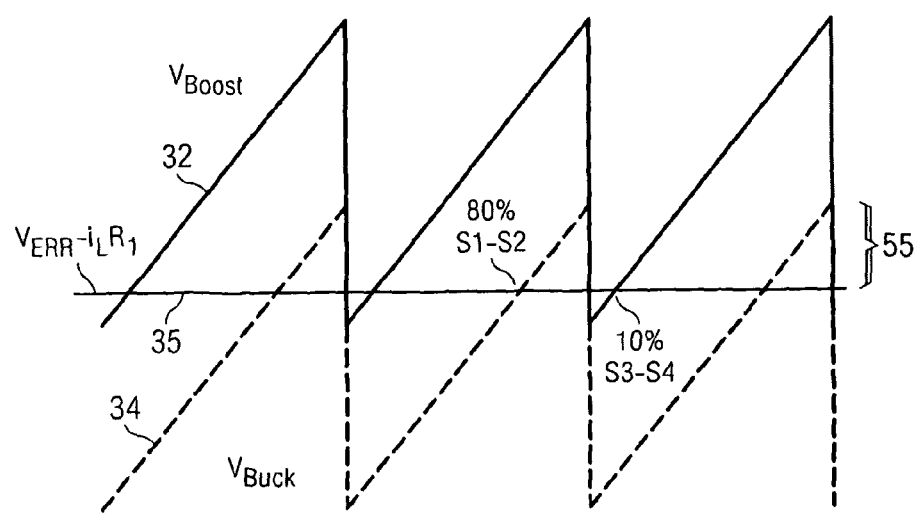
FIG. 5A shows overlapping modulating ramps at an optimal operating point for boost and buck modes.
Figure 5B:
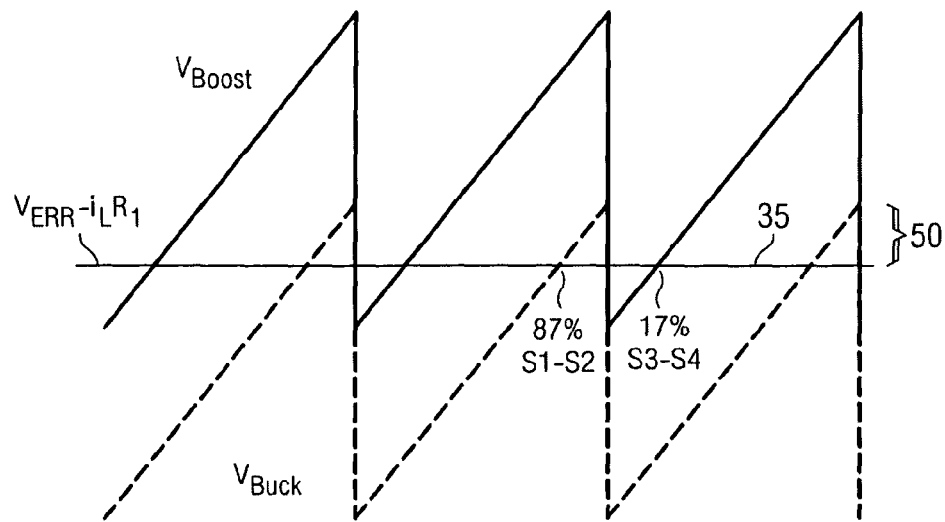
FIG. 5B shows overlapping modulating ramps at a non-optimal operating point for boost and buck modes.
Figure 6:
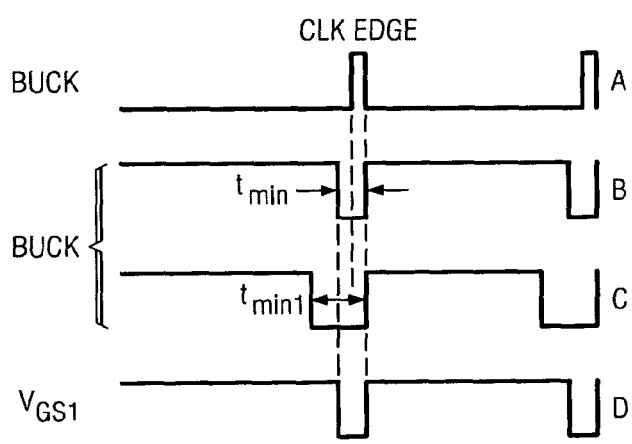
FIG. 6A shows a buck comparator output waveform.
FIG. 6B shows a clock reference pulse for maximum buck duty cycle until the transition to buck-boost mode.
FIG. 6C shows a clock reference pulse for minimum buck duty cycle in buck-boost mode.
FIG. 6D shows a gate pulse to switch S1.

Referring to FIG. 6, there are shown four waveforms (A, B, C, and D). Waveform 6A corresponds to output generated by buck comparator 26 ($C_{buck}$) for driving the gate of switch S2. Those of ordinary skill in the art can appreciate that the complement of the waveform shown in FIG. 6A is also generated for driving the gate of switch S1. Waveform 6B corresponds to a pre-established reference pulse that determines the maximum allowable pulse width or duty cycle for switch S1 in the buck mode. Waveform 6C, which will be discussed in greater detail below, corresponds to a pre-established fixed-width reference pulse, $t_{min1}$, that is the minimum pulse width of the switch S1 during buck-boost mode. Waveform 6D corresponds to the gate pulse (the gate-to-source voltage, $V_{GS1}$) that drives switch S1.

According to the present invention, initially, an allowable buck reference pulse is pre-established. The buck reference pulse has a pulse width of $t_{min}$ or the corresponding duty cycle such as shown in FIG. 6B. Recalling that in buck mode, the input voltage, $V_{IN}$, is greater than the output voltage, $V_O$, as the input voltage, $V_{IN}$, decreases and approaches the value of the output voltage, $V_O$, the pulse width of the output signal generated by the buck comparator 26 (FIG. 6A) to switch S2 narrows in width and/or the duty cycle decreases. This pulsewidth of the output signal (FIG. 6A) is continuously compared to the fixed-width or fixed duty cycle buck reference pulse (FIG. 6B).

At some input voltage, $V_{IN}$, very close to the output voltage, $V_O$, the pulse width of the buck comparator 26 output signal will equal or substantially equal the pulse width, $t_{min}$, of the buck reference pulse. When this occurs, the power converter 20 automatically and artificially transitions from pure buck mode to buck-boost mode without switching sub-harmonics and also without an overlap of the buck and boost modulation ramps as the buck modulation ramp still controls the pulse width or duty cycle to switches S1 and S2.

More specifically, when this occurs, the reference clock generates fixed-width or fixed duty cycle boost pulses (FIG. 7B) that are designed to close the gate at switch S3, i.e., to turn it ON, for the duration of the reference pulse and then to open the gate at switch S3 (STEP 3), i.e., to turn if OFF again. As this occurs, at complementary switch S4, the complement of the fixed-width boost reference pulse first opens the gate at switch S4, i.e., to turn it OFF, then closes the gate at switch S4, i.e., to turn it ON again.

These fixed-width boost pulses to the nonmodulated complementary switching pair S3 and S4 occur while the power converter 20 continues to generate buck mode pulses to control modulated complementary switching pair S1 and S2. In short, as the pulse width or duty cycle of the signal being modulated, i.e., the buck comparator 26 output signal to switch S2, narrows and its pulse width or duty cycle approaches the boundary limit, $t_{min}$, the reference clock generates fixed-width boost pulses that are transmitted to the nonmodulated complementary switching pair, i.e., S3 and S4, to force the power converter into buck-boost mode.

The generation and introduction of fixed-width boost reference pulses to nonmodulated complementary switching pair S3 and S4 produce excess energy because the duty cycle of nonmodulated complementary switching pair S3 and S4 is now greater than its required value, which was zero percent. However, since the voltage error signal is still being modulated by the buck modulation ramp, $V_{Buck}$, rather than the boost modulation ramp, $V_{Boost}$, the PWM feedback loop 25 can further reduce the pulse width of the buck duty cycle, to compensate for the energy discrepancy. As a result, the power converter 20 reaches an optimal operating point while eliminating any sub-harmonic switching oscillation.

Referring to FIG. 6D, throughout the transition from buck mode to buck-boost mode, the buck comparator 26 generates an output signal to drive the gate of switch S2, which will never be less than the pulse width, $t_{min}$, or corresponding duty cycle of the allowable buck reference.

Boost Mode to Buck-Boost Mode of Operation

The function and operation of the power conversion system will now be described in connection with a power converter 20 that initially is in pure boost mode, while the input voltage increases. During pure boost mode, SW2 is the modulated switch node; SW1 is the nonmodulated switch node; switch S1 (ON) and switch S2 (OFF) become the nonmodulated complementary switching pair; and switch S3 and switch S4 become the modulated complementary switching pair.

Figure 7:
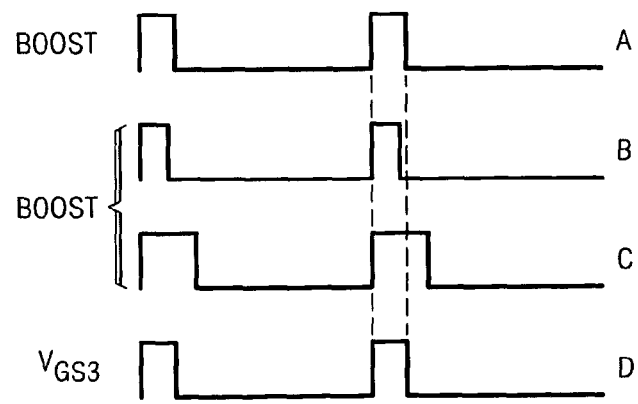
FIG. 7A shows a boost comparator output waveform.
FIG. 7B shows a clock reference pulse for minimum boost duty cycle until the transition to buck-boost mode.
FIG. 7C shows a clock reference pulse for maximum boost duty cycle in buck-boost mode.
FIG. 7D shows a gate pulse to switch S3.

Referring to FIG. 7, there are shown four waveforms (A, B, C, and D). Waveform 7A corresponds to the boost comparator 28 output signal for driving the gate of switch S3. Those of ordinary skill in the art can appreciate that the complement of the waveform shown in FIG. 7A is also generated for driving the gate of switch S4. Waveform 7B corresponds to a pre-established reference pulse that determines the minimum allowable pulse width or duty cycle of switch S3. Waveform 7C, which will be discussed in greater detail below, corresponds to a pre-established fixed-width reference pulse or fixed duty cycle for the maximum boost duty cycle during buck-boost mode. Waveform 7D corresponds to the gate pulse (the gate-to-source voltage, $V_{GS3}$) that drives switch S3.

Initially, an allowable reference pulse for the boost mode duty cycle, $t_{min}$, is pre-established. Recalling that in boost mode, the input voltage $V_{IN}$, is less than the output voltage $V_O$, as the input voltage, $V_{IN}$, increases and approaches the value of the output voltage, $V_O$, the pulse width of the boost comparator 28 output signal to switch S3 narrows (FIG. 7A). The output signal from the boost comparator 28 is continuously compared to the pulse width of the minimum allowable boost reference pulse (FIG. 7B) or to its corresponding duty cycle.

At some input voltage, $V_{IN}$, very close to the output voltage, $V_O$, the pulse width of the boost comparator 28 output will equal the pulse width of the allowable boost reference pulse or the duty cycle of the output will equal the allowable boost mode duty cycle. When this occurs, the power converter 20 will automatically and artificially transition from pure boost mode to buck-boost mode without switching subharmonics and also without an overlap of the buck and boost modulation ramps as the boost modulation ramp still controls the pulse width or duty cycle to switches S3 and S4.

More specifically, when this occurs, the reference clock generates a fixed-width buck pulse, e.g., the complement of FIG. 6B, that is transmitted to close the gate at switch S2, i.e., to turn it ON, for the duration of the buck reference pulse and then to open the gate at switch S2, i.e., to turn it OFF again. As this occurs, at complementary switch S1, the fixed-width buck reference pulse (FIG. 6B) first opens the gate at switch S1, i.e., to turn it OFF, then closes the gate at switch S1, i.e., to turn it ON again.

These fixed-width buck pulses or fixed buck duty cycles introduced to switching pair S1 and S2 occur while the system 20 continues to generate boost mode pulses to modulated complementary switching pair S3 and S4. In short, as the pulse width or duty cycle of the signal being modulated, i.e., the boost comparator 28 output to switch S3, narrows and its pulse width approaches the boundary limit, $t_{min}$, the reference clock generates fixed-width buck pulses that are transmitted to the nonmodulated complementary switching pair, i.e., S1 and S2, when the boundary limit is reached.

The generation and introduction of buck pulses to nonmodulated complementary switching pair S1 and S2 produce an energy shortage because the duty cycle of nonmodulated complementary switching pair S1 and S2 is now less than its required value, which was 100 percent. However, since the voltage error signal is still being modulated by the boost modulation ramp 32 rather than by the buck modulation ramp 34, the PWM feedback loop 25 can further increase the boost duty cycle or the pulse width of the boost pulse, to compensate for the energy discrepancy. Again, advantageously, the power converter 20 reaches an optimal operating point while eliminating any subharmonic switching oscillation.

Referring to FIG. 7D, throughout the transition from boost mode to buck-boost mode, the boost comparator 28 generates an output signal to drive the gate of switch S3 that will never be less than the pulse width or duty cycle of the minimum allowable boost reference.

Buck-Boost Mode to Buck or Boost Mode of Operation

The function and operation of the power conversion system will now be described in connection with a power converter 20 that initially is in buck-boost mode. During buck-boost mode, the power conversion system 20 is structured and arranged so that the voltage error signal is modulated by only one of the two modulation ramps, while the gate pulses corresponding to the nonmodulating ramp remain fixed-width or fixed duty cycle unregulated pulses. If the output signal pulses of the boost comparator 28 are wider than the minimum boost pulse width, i.e., the minimum pulse width transmitted to switch S3, then the voltage error signal is modulated by the boost modulation ramp 32. Alternately, if the output pulses of the buck comparator 26 are wider than the minimum buck pulse width, i.e., the minimum pulse width transmitted to switch S2, then the voltage error signal is modulated by the buck modulation ramp 34. Clearly, any overlap between the modulation ramps 32 and 34 cannot exceed a value that causes the outputs of both the buck and boost comparators 26 and 28 to exceed their limiting pulse widths. So long as this condition is met, subharmonic switching is avoided. The ramps 32 and 34 can, however, be significantly separated without resulting in any instability. Thus, the relative positioning requirements on the modulation ramps 32 and 34 are relaxed.

The power conversion system 20 remains in the buck-boost mode until either the buck mode OFF-pulse width, which is to say the pulse width transmitted to switch S2, exceeds a pre-establish boundary limit, $t_{min1}$, whereupon the controller 26 for the power converter 20 initiates buck mode, or the boost mode ON-pulse width, which is to say the pulse width transmitted to switch S3, exceeds the pre-established boundary limit, $t_{min1}$, whereupon the controller 28 for the power converter 20 initiates boost mode.

For example, referring to FIG. 6 and FIG. 7, during buck-boost mode, buck and boost comparator output signal pulses (FIG. 6A and FIG. 7A) can be compared to corresponding pre-established clock reference pulse $t_{min1}$ (FIG. 6C and FIG. 7C). The results of these comparisons are used to determine the new operating mode, whether pure boost mode or pure buck mode, and to generate the appropriate gate pulses.

Figure 8:
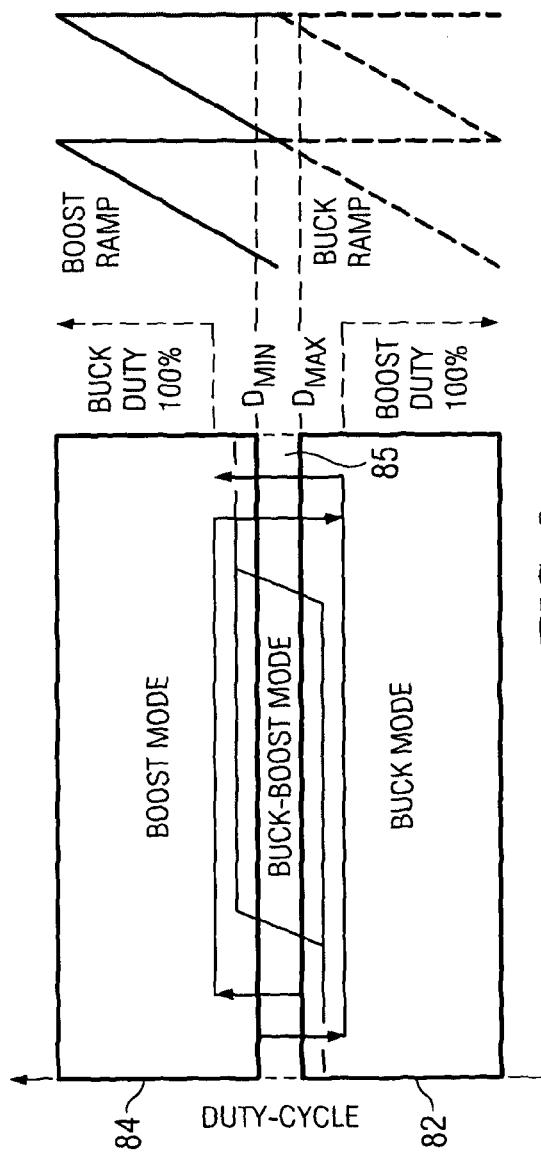
FIG. 8 shows the operating modes and transition limits between modes.

As shown in FIG. 8, buck-boost operation includes a hysteresis by which the pulse width or duty cycle needed to exit the buck-boost mode either into pure buck or into pure boost mode must be wider than the pulse width or duty cycle needed to enter the buck-boost mode from either the buck mode or the boost mode, i.e., the pulse width of the pre-established clock reference pulse $t_{min1}$ is greater than the pulse width of pre-established clock reference pulse $t_{min}$. The width of this hysteresis corresponds to the temporal difference between the pre-established limiting pulse widths, $t_{min1}$ and $t_{min}$, which is shown illustratively as the portions of the buck-boost mode 85 that extend into pure buck 82 and into pure boost mode 84 of FIG. 8.

For example, while the system is operating in buck-boost mode, the input voltage, $V_{IN}$, is equal to or substantially equal to the output voltage, $V_O$. The output signal from the buck comparator 26 and the output signal from the boost comparator 28 are continuously being compared to the buck reference pulse in FIG. 6C and to the boost reference pulse in FIG. 7C, respectively. If the input voltage increases, the pulse width of the buck comparator 26 output broadens or the pulse width to the gate of switch S1 decreases. When the pulse width of the buck comparator 26 output equals or substantially equals the buck reference pulse width $t_{min1}$ (FIG. 6C) the system enters pure buck mode. As a result, the control circuit generates a gate pulse to switch S3, $V_{GS3}$, that opens switch S3, i.e., turns it OFF, and closes switch S4, i.e., turns it ON. With switch S3 now open continuously and switch S4 now closed continuously, the power converter 20 is operating in pure buck mode. Meanwhile the buck comparator 26 continues to generate output signals to modulate switches S1 and S2. Moreover, the buck modulation ramp 34 controls the voltage error signal.

If, on the other hand, during buck-boost mode, the input voltage decreases, the pulse width of the boost comparator 28 output signal broadens or the duty cycle increases. When the pulse width of the boost comparator 28 output signal (FIG. 7A) equals or substantially equals the boost reference pulse $t_{min1}$ shown in FIG. 7C the system enters pure boost mode. As a result, the control circuit generates a gate pulse to switch S1, $V_{GS1}$, to close switch S1, i.e., turn it ON, and to open switch S2, i.e., turn it OFF, and closes switch S4, i.e., turns it ON. With switch S2 now open continuously and switch S1 now closed continuously, the power converter 20 is operating in pure boost mode. Meanwhile the boost comparator 28 continues to generate output signals to modulate switches S3 and S4. Moreover, the boost modulation ramp 32 controls the voltage error signal.

In comparison with conventional buck-boost power controllers, such as the previously mentioned TPS63000, the expected benefits include simplification of PWM control in the buck-boost mode by modulating the voltage error signal by one and only one of the two modulation ramps. This reduces modulator gain, easing stability requirements. Moreover, the switch reference pulses corresponding to the non-modulated ramp have a fixed and easily controllable minimum width or a fixed duty cycle. Indeed, nonmodulated switch pulse widths or duty cycles can be maintained at minimum possible widths that are required to maintain regulation, maximizing efficiency. As a result, switching in any of the operation modes (buck, boost or buck-boost) occurs at a predetermined switching frequency, addressing ripple and EMI concerns in existing controllers. Finally, the buck and boost modulation ramps do not have to be accurately positioned with respect to each other so long as their overlap is less than a predetermined limit. This simplifies circuit design.

Additionally, the proposed control method is flexible for concurrent use with voltage-mode or current-mode control. In buck-boost mode, since all four switches switch ON and OFF during the switching cycle, the number of switching events per switching cycle is doubled, which doubles the switching losses. The proposed method, however, is compatible with an option to reduce the switching frequency in the buck-boost mode to half its regular value in order to maintain the number of switching events constant through all modes, further improving efficiency.

Figure 13A:
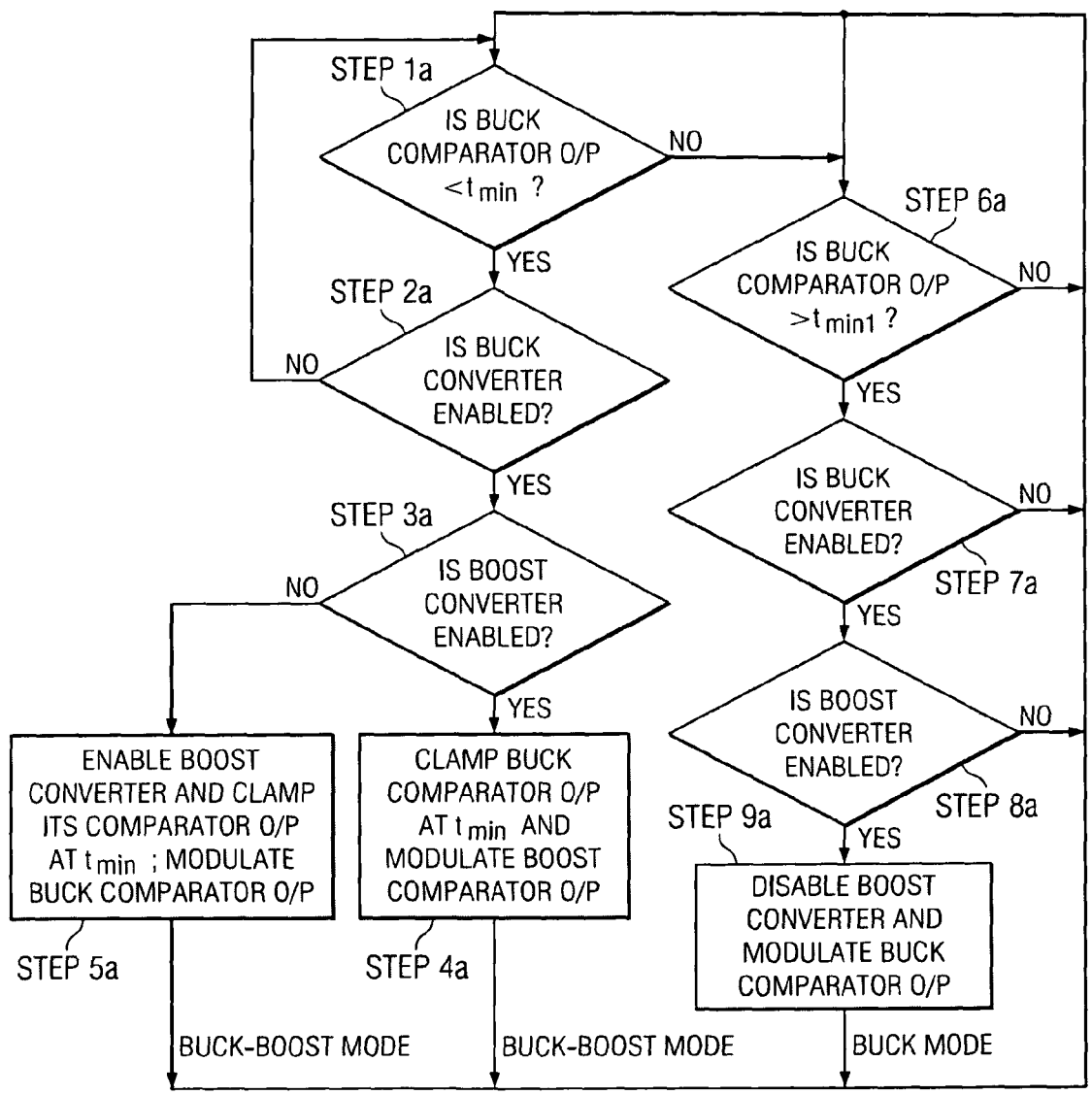
FIG. 13A shows a flow chart of control logic for determining the mode of operation from the output of a buck comparator.
Figure 13B:
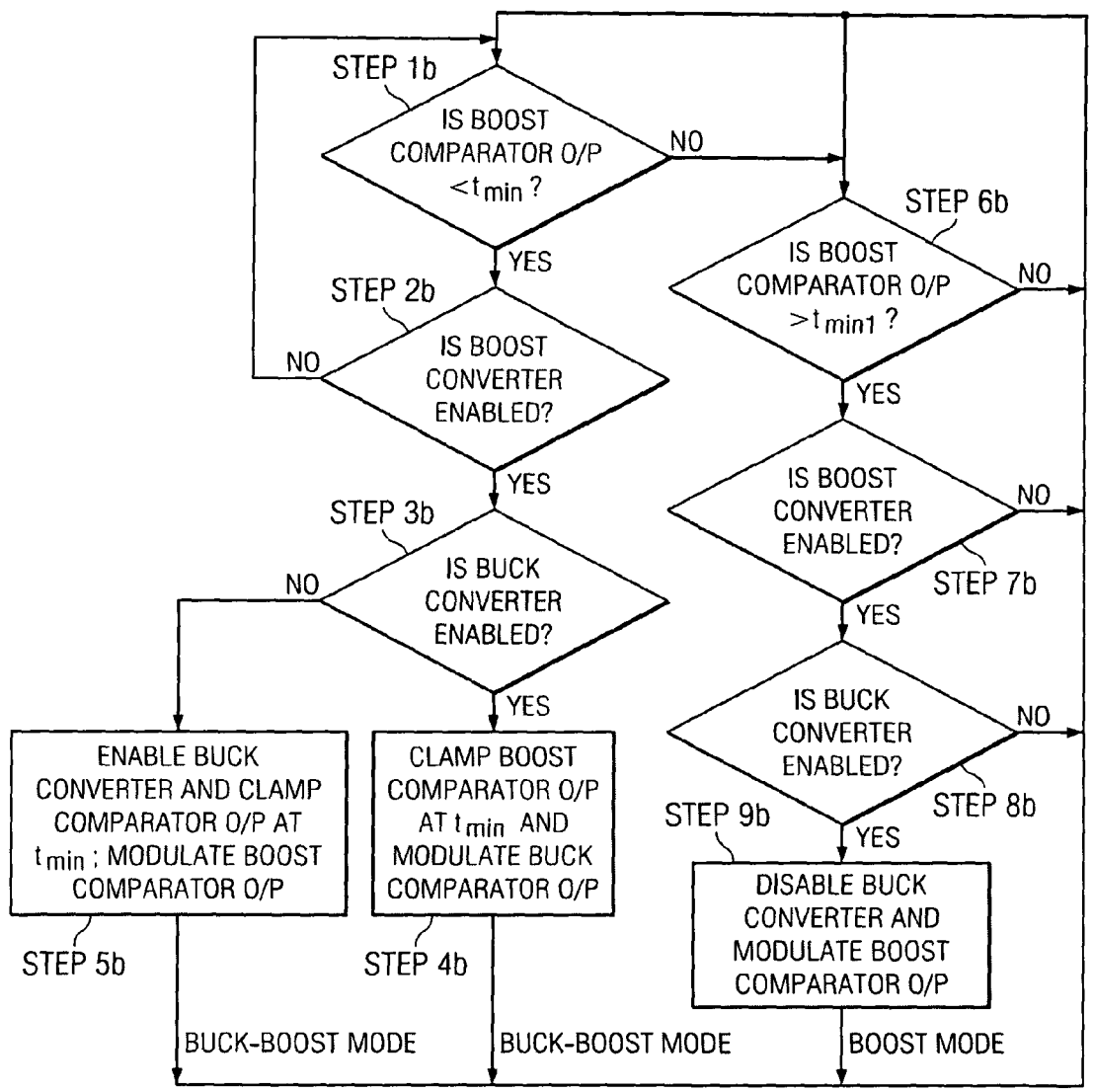
FIG. 13B shows a flow chart of control logic for determining the mode of operation from the output of a boost comparator.

The invention has been described as going from one mode to another; however, such transitions can occur repeatedly. Referring to FIGS. 13A and 13B, flow charts of the logic used to determine the mode of operation are used. Although the flow charts shown are separate, this is done for convenience of description, because, in application, the buck comparator 26 and the boost comparator 28 are simultaneously and continuously determining the mode of operation and generating reference pulses as necessary.

For example, in a first step, the buck comparator's 26 output signal is compared to the buck reference pulse, $t_{min}$ (STEP 1a). If the width of the output signal does not exceed the buck reference width, $t_{min}$, the controller ascertains whether or not the buck converter 26 is enabled (STEP 2a) and whether or not the boost converter 28 is enabled (STEP 3a). If the buck converter 26 is not enabled then the controller does nothing and the power converter 20 remains in the existing, i.e., boost, mode. If, however, the buck converter 26 is enabled and the boost converter is not 28, then the controller is adapted to generate signals to transition to the buck-boost mode depending on whether the boost converter 28 is enabled or disabled.

On one hand, if the buck converter 26 and the boost converter 28 are each enabled, the controller is adapted to clamp the output from the buck comparator 26 at the width of the buck reference pulse, $t_{min}$, while output signals to switch S3 and switch S4 are modulated by the boost comparator 28 using the boost modulation ramp (STEP 4a). On the other hand, if the buck converter 26 is enabled but the boost converter 28 is disabled, then the controller is adapted to first enable the boost converter 28 and then to clamp the output signal from the boost converter 28 to the width of the buck reference pulse, $t_{min}$, while modulating the output signal from the buck comparator 26 to switch S1 and switch S2 (STEP 5a). In either instance, with both complementary switch pairs being switched, the power converter operates in buck-boost mode.

Returning to the first step, in the initial comparison (STEP 1a), if the buck comparator's output is greater than the width of the buck reference pulse, $t_{min}$, then the output from the buck comparator 26 is compared to the width of the maximum allowable buck reference pulse, $t_{min1}$ (STEP 6a). The controller is further adapted to ascertain whether or not the buck converter 26 is enabled (STEP 7a) and whether or not the boost converter 28 is enabled (STEP 8a). If the buck converter 26 and/or the boost comparator 28 is/are disabled then the controller does nothing. However, if the buck converter 26 and the boost converter 28 are both enabled, the controller is adapted to generate signals to transition the power converter 20 to buck mode.

For example, if both the buck converter 26 and the boost converter 28 are enabled, the controller can first disable the boost converter 28 and then modulate the output signal from buck comparator 26 to switch S1 and switch S2 (STEP 9a).

Simultaneously, in a first step, the boost comparator's 28 output signal is compared to the boost reference pulse, $t_{min}$ (STEP 1b). If the width of the output signal is less than the boost reference pulse width, $t_{min}$, the controller ascertains whether or not the boost converter 28 is enabled (STEP 2b) and whether or not the buck converter 26 is enabled (STEP 3b). If the boost converter 28 is disabled, then the controller does nothing and the power converter 20 remains in existing, i.e., buck, mode. However, when the boost converter 28 is enabled, then the controller is adapted to generate signals to transition to the buck-boost mode depending on whether the buck converter 26 is enabled or disabled.

On one hand, when both the buck converter 26 and the boost converter 28 are enabled, the controller is adapted to clamp the output from the boost comparator 28 at the boost reference pulse, $t_{min}$, while output signals to switch S1 and switch S2 are modulated by the buck comparator 26 using the buck modulation ramp (STEP 4b). On the other hand, when the boost converter 28 is enabled but the buck converter 26 is disabled, then the controller is adapted to first enable the buck converter 26 and then to clamp the output signal from the buck converter 26 at the width of the buck reference pulse, $t_{min}$, while modulating the output signal from the boost comparator 28 to switch S3 and switch S4 (STEP 5b). In either instance, with both complementary switch pairs being switched, the power converter operates in buck-boost mode.

Returning again to the first step, in the initial comparison (STEP 1b), if the boost comparator's output pulse width is greater than the boost reference pulse width, $t_{min}$, then the output from the boost comparator 28 is compared to the maximum allowable boost reference pulse, $t_{min1}$ (STEP 6b). The controller is further adapted to ascertain whether or not the boost converter 28 is enabled (STEP 7b) and whether or not the buck converter 26 is enabled (STEP 8b). If the boost comparator's output does not exceed the maximum allowable boost reference pulse, $t_{min1}$, and/or if buck converter 26 is disabled, and/or if the boost comparator 28 is disabled, then the controller does nothing. If, however, the buck converter 26 and the boost converter 28 are enabled, the controller generates signals to transition the power converter 20 to boost mode.

For example, if both the buck converter 26 and the boost converter 28 are enabled, the controller can first disable the buck converter 26 and then modulate the output signal from boost comparator 28 to switch S3 and switch S4 (STEP 9b).

Results of Simulations

Figure 9A:
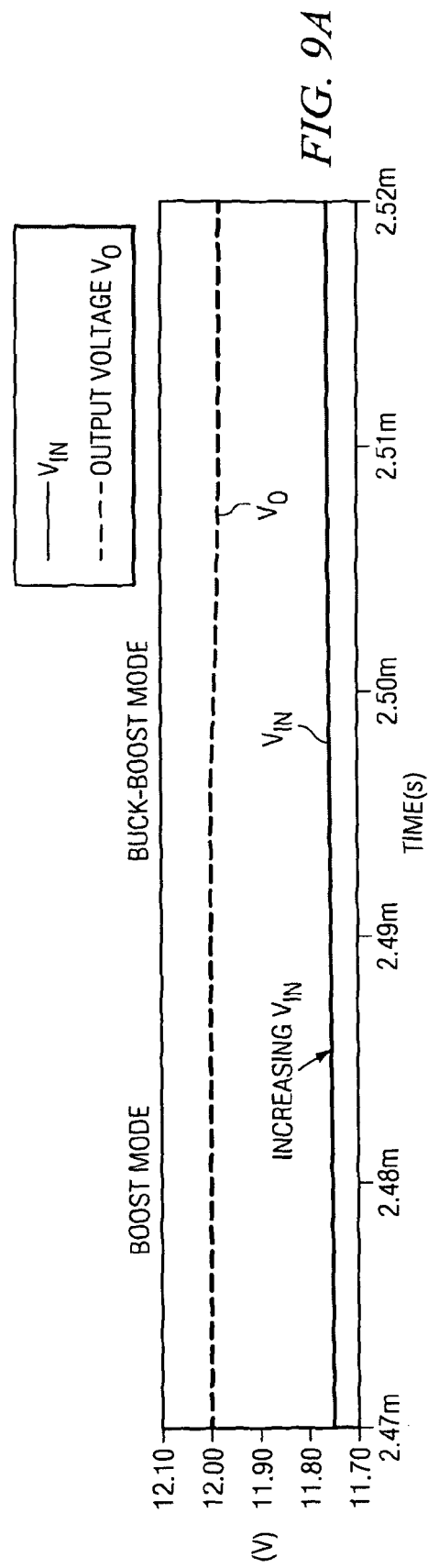
FIG. 9A shows simulation results for the output and input voltages in boost mode and buck-boost mode.
Figure 9B:
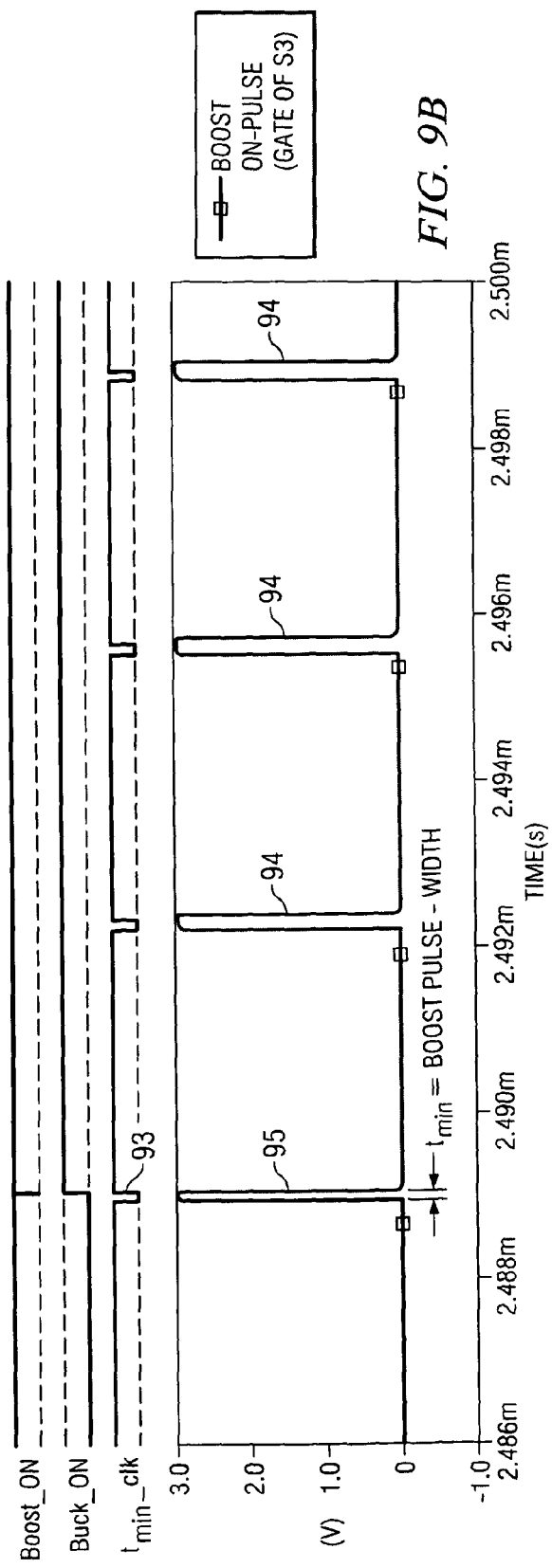
FIG. 9B shows simulation results for boost pulses to switch S3 in boost mode and buck-boost mode.
Figure 9C:
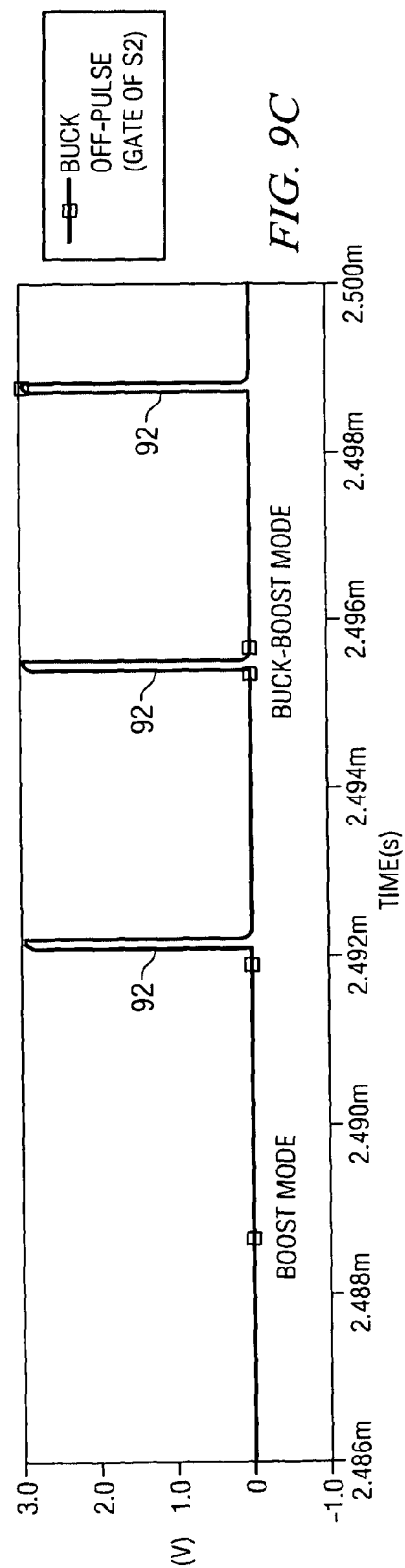
FIG. 9C shows simulation results for buck pulses to switch S2 in boost mode and buck-boost mode.

Results of simulations performed for an input voltage, $V_{IN}$, between 11.5-13.5V, an output voltage, $V_O$, equal to 12V, and a output current, $I_O$, equal to 2A, are shown in FIG. 9A to 9C. FIG. 9A shows an increasing input voltage, $V_{IN}$, and a constant output voltage, $V_O$, depicting a power converter 20 that is initially operating in boost mode with nonmodulated switch S1 closed (ON) and nonmodulated switch S2 open (OFF) for the entire switching cycle. As the input voltage, $V_{IN}$, increases from 11.5V to approximately 11.75V, the pulse width of the boost ON-duty cycle signal 95 applied to the gate of switch S3 (FIG. 9B) narrows. The boost ON-duty cycle signal 95 is continuously compared with a pre-established, 100 nanosecond (ns) clock reference duty cycle signal 93, $t_{min}$. The comparison is performed automatically and continuously until the pulse width of the boost ON-duty cycle 95 equals or substantially equals 100 ns.

As soon as this equality occurs, control logic initiates the transition from boost mode to buck-boost mode, which takes place at approximately 2.49 milliseconds (msec). The onset of the buck-boost mode is accompanied by the generation of fixed-width, e.g., 100 ns, buck reference OFF-pulses 92 that drive the gate of switch S2 from 2.492 msec. In response to the feedback caused by these buck reference OFF-pulses 92, the pulse widths of the boost duty cycle 94 increase until they fully compensate for the energy shortage caused by the buck reference OFF-pulses 92.

Figure 10:
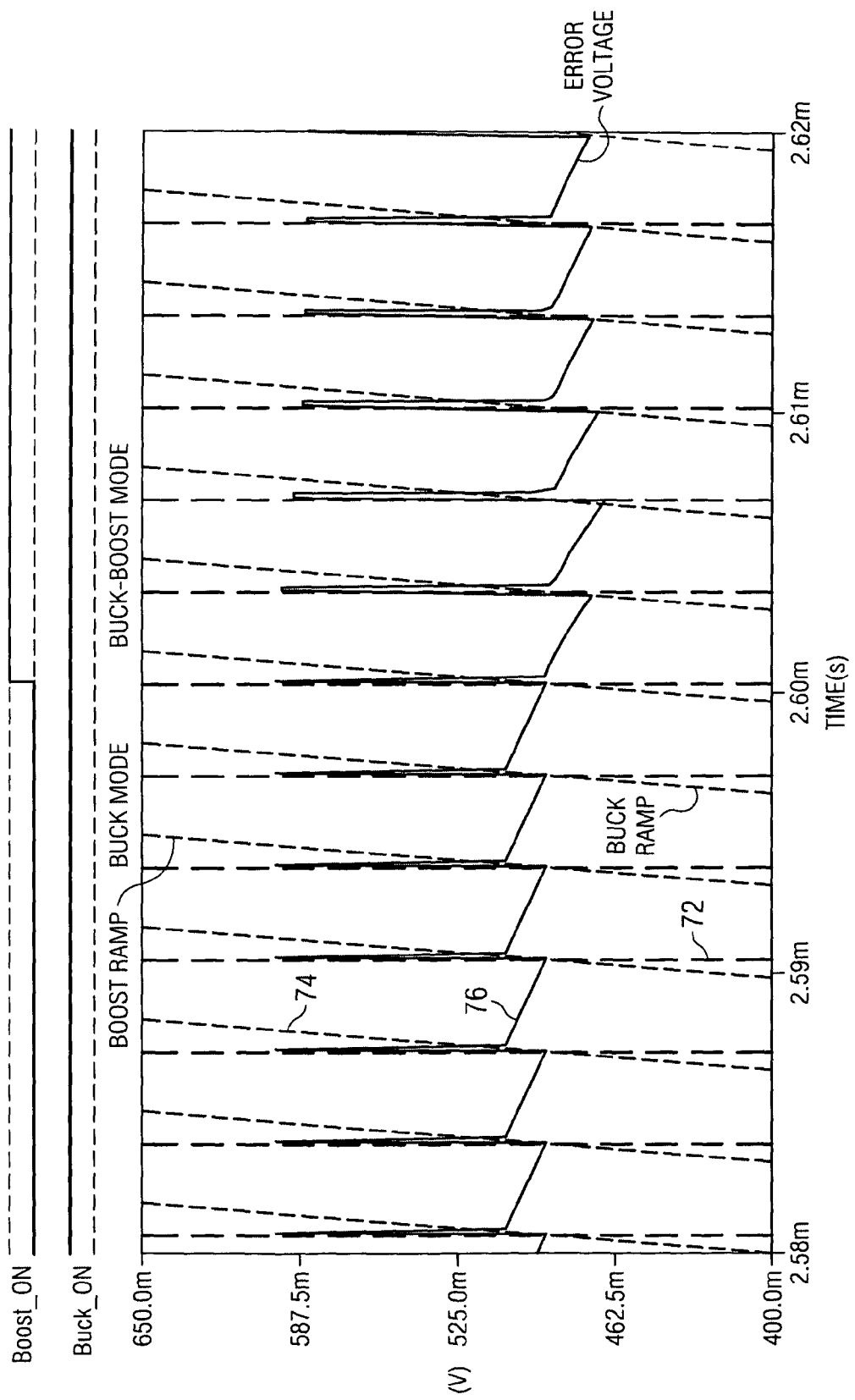
FIG. 10 shows buck and boost modulation ramps and voltage error signal simulation results for buck mode and buck-boost mode.

FIG. 10 shows buck and boost modulation ramps 72 and 74 and a voltage error signal 76 for a power converter initially operating in pure buck mode as it transitions into buck-boost mode. In buck mode, nonmodulated switch S4 is closed (ON) and nonmodulated switch S3 is open (OFF) for the entire switching cycle. As the input voltage, $V_{IN}$, decreases and approaches the output voltage, $V_O$, the pulse width of the buck OFF-duty cycle signal applied to the gate of switch S2 narrows. The pulse width of the buck ON-duty cycle is compared with the pre-established clock reference duty cycle signal, $t_{min}$. The comparison is performed automatically and continuously until the pulse width of the buck duty cycle equals or substantially equals 100 ns.

When this equality occurs, control logic initiates the transition from buck mode to buck-boost mode, which is shown as taking place at approximately 2.60 msec. The onset of the buck-boost mode is accompanied by the generation of fixed-width, e.g., 100 ns, boost reference pulses to drive the gate of switch S3. In response to the feedback caused by these fixed width or fixed duty cycle boost pulses, the widths of the buck pulses decrease until they compensate for the energy excess caused by the boost pulses.

Figure 11A:
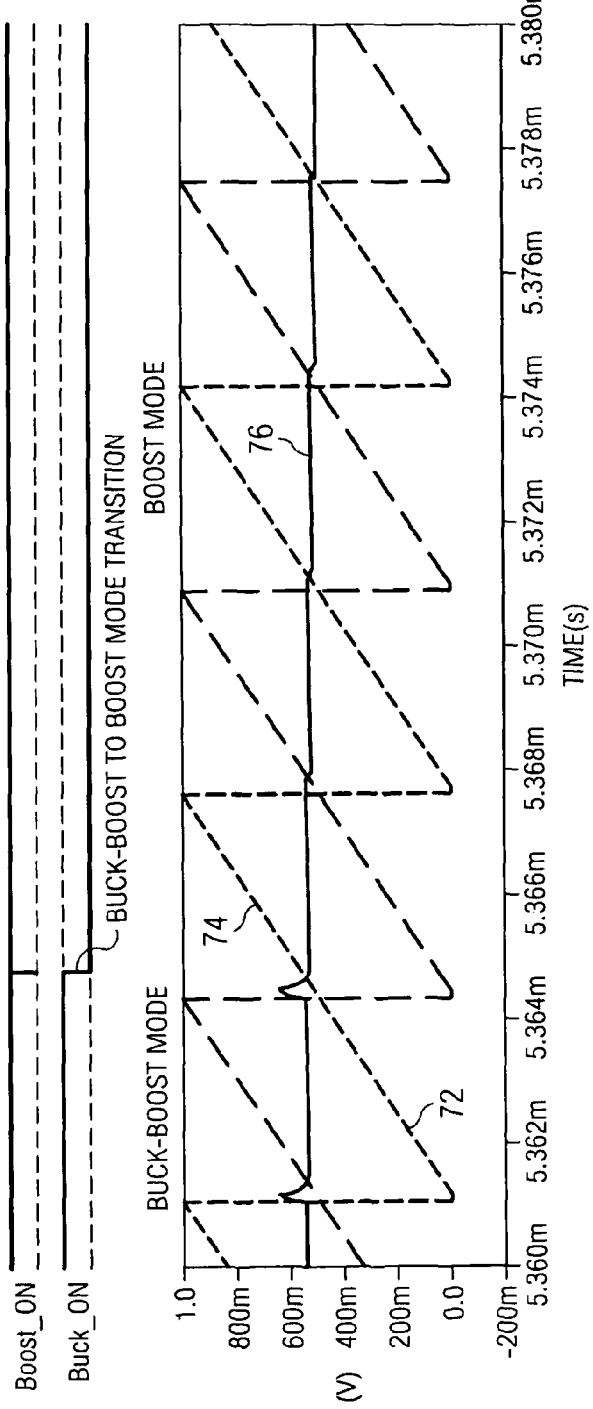
FIG. 11A shows buck and boost modulation ramps and voltage error signal simulation results for buck-boost mode and boost mode.
Figure 11B:
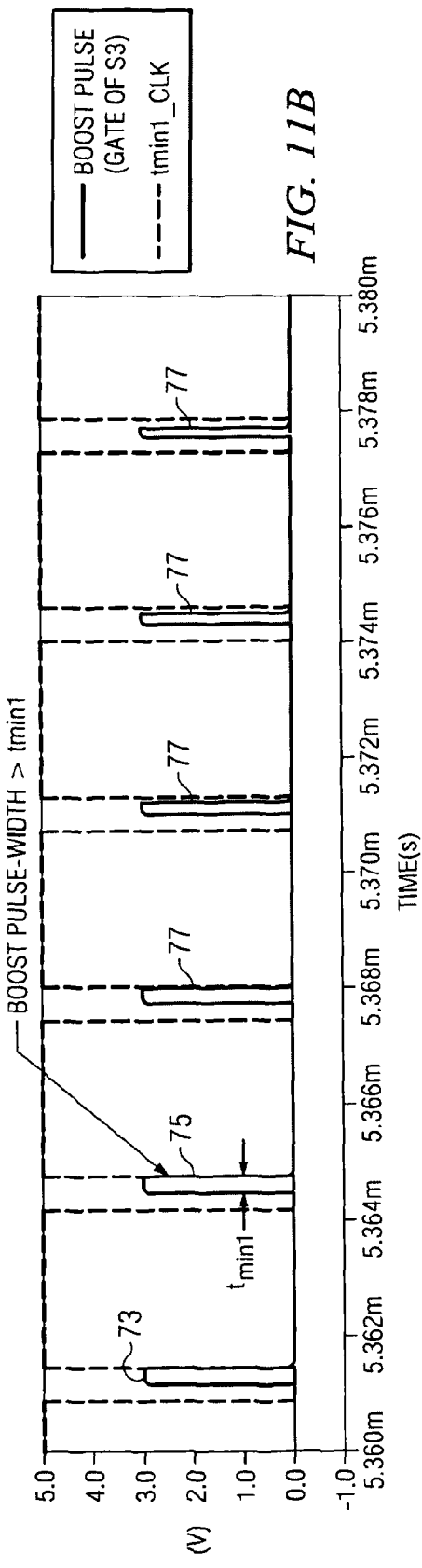
FIG. 11B shows simulation results for boost pulses to switch S3 in buck-boost mode and boost mode.
Figure 12A:
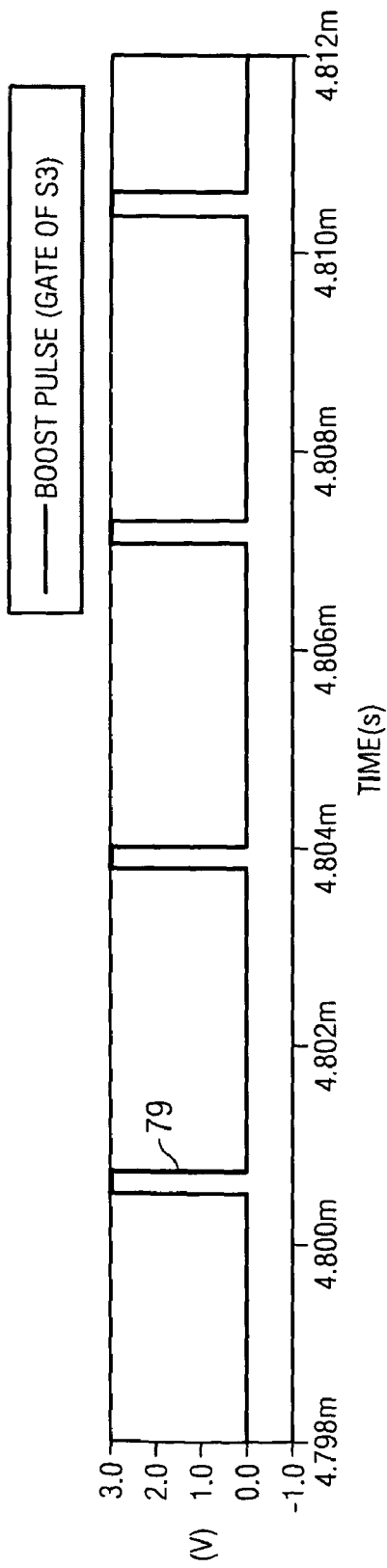
FIG. 12A shows simulation results of boost pulse to switch S3.
Figure 12B:
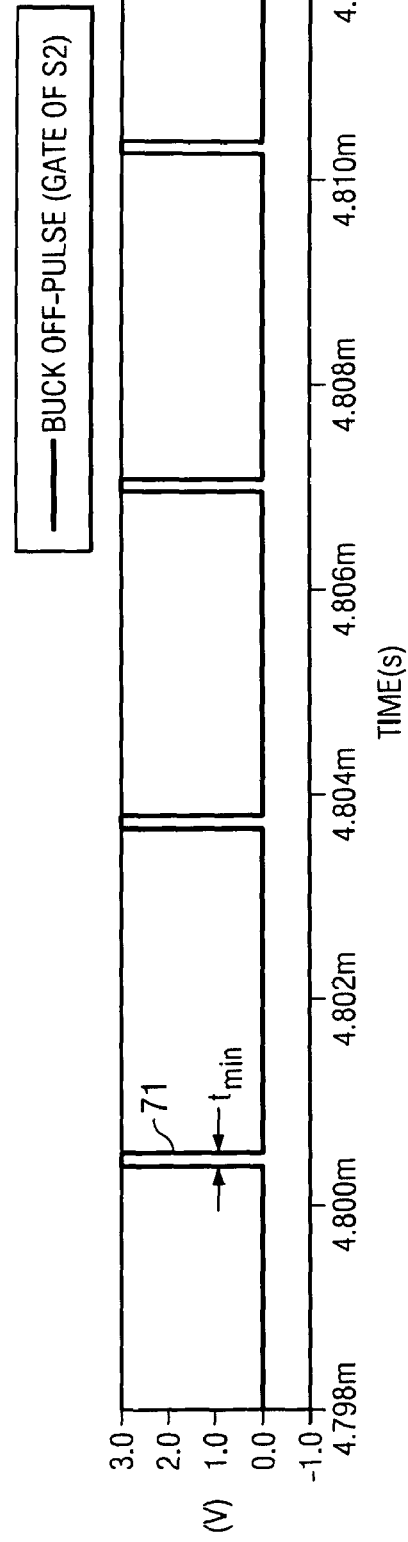
FIG. 12B shows simulation results of buck pulse to switch S2.
Figure 12C:
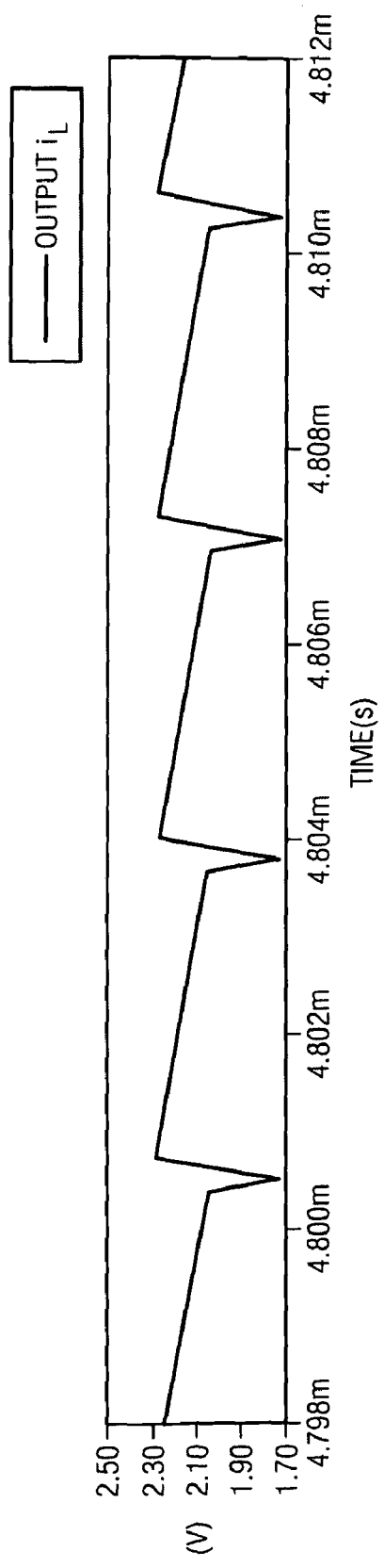
FIG. 12C shows simulation results of voltage associated with the inductor current with a one-ohm resistance in buck-boost mode.
Figure 12D:
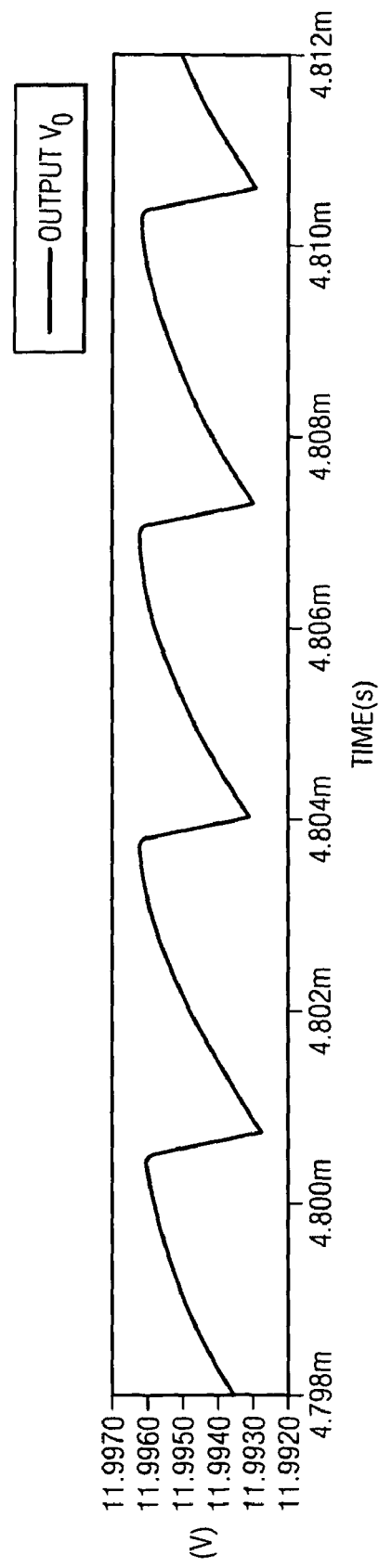
FIG. 12D shows simulation results of the output voltage in buck-boost mode.

FIG. 11A and FIG. 11B show a transition from buck-boost mode to boost mode. FIG. 11A shows the boost modulation ramp 74 superimposed above the buck modulation ramps 72 and the voltage error signal 76. FIG. 11B shows the output signal pulses generated by the boost comparator 28 and applied to the gate of switch S3. As the input voltage, $V_{IN}$, decreases, the width of the boost pulse 73 applied to the gate of switch S3 (FIG. 11B) broadens, approaching a boost reference value, $t_{min1}$.

When the width of the boost pulse 75 equals the boost reference value, $t_{min1}$, which is shown in FIG. 11B taking place at approximately 5.364 msec, control logic initiates the transition from buck-boost mode to boost mode. The onset of boost mode is accompanied by the absence of buck pulses (not shown), i.e., switch S1 is permanent closed and switch S2 is permanently open. As shown in FIG. 11B, in response to the removal of buck pulses, the pulse widths of the boost pulses 77 continue to decrease until they compensate for the energy dearth resulting from removal of the buck pulses.

FIG. 12 shows steady-state waveforms in the buck-boost mode in which the buck OFF-pulses, i.e., to the gate of switch S2, are at a fixed, minimum pulse width 71, i.e., $t_{min}$, (FIG. 12B) while the boost ON-pulses 79, i.e., to the gate of switch S3, (FIG. 12A) are controlled by the PWM feedback loop 25 and are, therefore, wider than the minimum value of 100 ns. The corresponding inductor current, $i_L$, and output voltage, $V_O$, are shown in FIG. 12C and FIG. 12D, respectively.

Although the invention has been described in connection with a buck-boost power converter, the invention is not to be construed as being limited thereto. Those of ordinary skill in the art will appreciate the applicability of the teachings to other multiple switch node power converters, such as boost-buck converters, buck-boost-buck converters, boost-buck-boost converters and the like. Those of ordinary skill in the art will also appreciate that variations to and modification of the above-described device, system, and method are possible. Accordingly, the invention should not be viewed as limited except as by the scope and spirit of the appended claims.

What is claimed is:

1. A method of modulating an error signal for a multiple switch node power converter having a modulated complementary switching pair controlled by a first modulation ramp and a nonmodulated complementary switching pair controlled by a second modulation ramp, using the first modulation ramp, the method comprising:

establishing a first reference duty cycle or pulse width for the modulated complementary switching pair;

comparing a present duty cycle or pulse width for the modulated complementary switching pair to the first reference duty cycle or pulse width;

generating a plurality of fixed-width or fixed duty cycle pulses when the duty cycle or pulse width for the modulated complementary switching pair is equal to or substantially equal to the first reference duty cycle or pulse width; and introducing the plurality of fixed-width or fixed duty cycle pulses to the nonmodulated complementary switching pair while continuing to modulate the modulated complementary switching pair using the first modulation ramp.

2. The method as recited in claim 1 wherein there is no overlap between the first modulation ramp and the second modulation ramp when either the first modulation ramp or the second modulation ramp is superimposed over the other modulation ramp.

3. The method as recited in claim 1 further comprising compensating for an increase or a decrease in energy at an output voltage by modifying a duty cycle to the modulated complementary switching pair generated by the first modulation ramp.

4. The method as recited in claim 1 further comprising:
establishing a second reference duty cycle or pulse width;
comparing duty cycles or pulse widths generated using the first modulation ramp and duty cycles or pulse widths generated using the second modulation ramp to the second reference duty cycle or pulse width;
initiating a single mode of power conversion operation when either of said duty cycles or pulse widths are equal to or substantially equal to the second reference duty cycle or pulse width.

5. The method as recited in claim 4, wherein the single mode of power conversion operation is buck mode or boost mode.

6. The method as recited in claim 4, wherein when the duty cycles or pulse widths generated using the first modulation ramp are equal to or substantially equal to the second minimum duty cycle or pulse width, the power converter will transition to the single mode of power conversion corresponding to the first modulation ramp.

7. The method as recited in claim 6, wherein before the power converter transitions to the single mode of power conversion corresponding to the first modulation ramp, the method includes introducing a plurality of fixed-width or fixed duty cycle pulses to the complementary switching pair controlled by the second modulation ramp.

8. The method as recited in claim 4, wherein when the duty cycles or pulse widths generated using the second modulation ramp are equal to or substantially equal to the second reference duty cycle or pulse width, the power converter will transition to the single mode of power conversion corresponding to the second modulation ramp.

9. The method as recited in claim 8, wherein before the power converter transitions to the single mode of power conversion corresponding to the second modulation ramp, the method includes introducing a plurality of fixed-width or fixed duty cycle pulses to the complementary switching pair controlled by the first modulation ramp.

10. A method of controlling a multiple switch node power converter having a modulated complementary switching pair controlled by a first modulation ramp and a nonmodulated complementary switching pair controlled by a second modulation ramp, to avoid switching sub-harmonics, the method comprising:
establishing a first reference duty cycle or pulse width for the modulated complementary switching pair;
comparing a present duty cycle or pulse width for the modulated complementary switching pair to the first minimum duty cycle or pulse width;
generating a plurality of fixed-width or fixed duty cycle pulses when the duty cycle or pulse width for the modulated complementary switching pair is equal to or substantially equal to the first minimum duty cycle or pulse width; and
introducing the plurality of fixed-width or fixed duty cycle pulses to the nonmodulated complementary switching pair while continuing to modulate the modulated complementary switching pair using the first modulation ramp.

11. The method as recited in claim 10 wherein there is no overlap between the first modulation ramp and the second modulation ramp when either the first modulation ramp or the second modulation ramp is superimposed over the other modulation ramp.

12. The method as recited in claim 10 further comprising compensating for an increase of a decrease in energy at an output voltage by modifying a duty cycle to the modulated complementary switching pair generated by the first modulation ramp.

13. The method as recited in claim 10 further comprising:
establishing a second reference duty cycle or pulse width;
comparing duty cycles or pulse widths generated using the first modulation ramp and duty cycles or pulse widths generated using the second modulation ramp to the second reference duty cycle or pulse width;
initiating a single mode of power conversion operation when either of said duty cycles or pulse widths are equal to or substantially equal to the second reference duty cycle or pulse width.

14. The method as recited in claim 13, wherein the single mode of power conversion operation is buck mode or boost mode.

15. The method as recited in claim 13, wherein when the duty cycles or pulse widths generated using the first modulation ramp are equal to or substantially equal to the second minimum duty cycle or pulse width, the power converter will transition to the single mode of power conversion corresponding to the first modulation ramp.

16. The method as recited in claim 15, wherein before the power converter transitions to the single mode of power conversion corresponding to the first modulation ramp, the method includes introducing a plurality of fixed-width or fixed duty cycle pulses to the complementary switching pair controlled by the second modulation ramp.

17. The method as recited in claim 13, wherein when the duty cycles or pulse widths generated using the second modulation ramp are equal to or substantially equal to the second reference duty cycle or pulse width, the power converter will transition to the single mode of power conversion corresponding to the second modulation ramp.

18. The method as recited in claim 17, wherein before the power converter transitions to the single mode of power conversion corresponding to the second modulation ramp, the method includes introducing a plurality of fixed-width or fixed duty cycle pulses to the complementary switching pair controlled by the first modulation ramp.

19. A multiple switch node power converter that avoids switching sub-harmonics, the power converter comprising:
a first controller that is adapted to generate a plurality of first output signals based on a comparison between a voltage error signal or current error signal and a first modulation ramp;
a second controller that is adapted to generate a plurality of second output signals based on a comparison between the voltage error signal or the current error signal and a second modulation ramp;
a modulated complementary pair of switching devices that is controlled by the first controller;
a nonmodulated complementary pair of switching devices that is controlled by the second controller;
a feedback loop that is structured and arranged to sense an output voltage or output current and to generate, respectively, a voltage error signal or a current error signal based on a comparison between the scaled output voltage or current and a voltage or current reference and to introduce the voltage error signal or the current error signal into the first and second controllers;
an established first reference duty cycle or pulse width for modulating the modulated complementary pair of switching devices; and
a clock reference that is adapted to generate a plurality of fixed width or fixed duty cycle pulses to the nonmodulated complementary pair of switching devices when the duty cycle or pulse width for the modulated complementary pair of switching devices is equal to or substantially equal to the first reference minimum duty cycle or pulse width,
wherein the first controller and the first modulation ramp are structured and arranged to continue to modulate the modulated complementary pair of switching devices while the plurality of fixed-width or fixed duty cycle pulses is introduced to the nonmodulated complementary pair of switching devices.

20. The system as recited in claim 19, wherein when either the first modulation ramp or the second modulation ramp is superimposed over the other modulation ramp there is no overlap between the first modulation ramp and the second modulation ramp.

21. The system as recited in claim 19, wherein the first controller and first modulation ramp are structured and arranged to compensate for an increase or a decrease in energy at an output voltage or an output current by modifying a duty cycle or pulse width to the modulated complementary pair of switching devices.

22. The system as recited in claim 19 further comprising:
an established second reference duty cycle or pulse width,
wherein the clock reference is adapted to initiate a single mode of power conversion operation when either of said duty cycles or pulse widths are equal to or substantially equal to the second reference duty cycle or pulse width.

23. The system as recited in claim 22, wherein the single mode of power conversion operation is buck mode or boost mode.

24. The system as recited in claim 22, wherein when the duty cycles or pulse widths generated using the first modulation ramp are equal to or substantially equal to the second reference duty cycle or pulse width, the system is adapted to transition to the single mode of power conversion corresponding to the first modulation ramp.

25. The system as recited in claim 24, wherein before the system transitions to the single mode of power conversion corresponding to the first modulation ramp, the clock reference is adapted to generate a plurality of fixed-width or fixed duty cycle pulses to the complementary pair of switching devices controlled by the second modulation ramp.

26. The system as recited in claim 22, wherein when the duty cycles or pulse widths generated using the second modulation ramp are equal to or substantially equal to the second reference duty cycle or pulse width, the system is adapted to transition to the single mode of power conversion corresponding to the second modulation ramp.

27. The system as recited in claim 26, wherein before the system transitions to the single mode of power conversion corresponding to the second modulation ramp, the clock reference is adapted to generate a plurality of fixed-width or fixed duty cycle pulses to the complementary pair of switching devices controlled by the first modulation ramp.

28. A control system that avoids switching sub-harmonics in a multiple switch node power converter, the system comprising:
a first controller that is adapted to generate a plurality of first output signals based on a comparison between a voltage error signal or a current error signal and a first modulation ramp;
a second controller that is adapted to generate a plurality of second output signals based on a comparison between the voltage error signal or the current error signal and a second modulation ramp;
a modulated complementary pair of switching devices that is controlled by the first controller;
a nonmodulated complementary pair of switching devices that is controlled by the second controller;
a feedback loop that is structured and arranged to sense an output voltage or an output current and to generate, respectively, a voltage error signal or a current error signal based on a comparison between the scaled output voltage or scaled output current and a voltage reference or current reference and to introduce the voltage error signal or the current error signal into the first and second controllers;
an established first reference duty cycle or pulse width for modulating the modulated complementary pair of switching devices; and
a clock reference that is adapted to generate a plurality of fixed-width or fixed duty cycle pulses to the nonmodulated complementary pair of switching devices when the duty cycle or pulse width for the modulated complementary pair of switching devices is equal to or substantially equal to the first reference duty cycle or pulse width,
wherein the first controller and the first modulation ramp are structured and arranged to continue to modulate the modulated complementary pair of switching devices while the plurality of fixed-width or fixed duty cycle pulses is introduced to the nonmodulated complementary pair of switching devices.

29. The system as recited in claim 28, wherein when either the first modulation ramp or the second modulation ramp is superimposed over the other modulation ramp there is no overlap between the first modulation ramp and the second modulation ramp.

30. The system as recited in claim 28, wherein the first controller and first modulation ramp are structured and arranged to compensate for an increase or a decrease in energy at an output voltage or current by modifying a duty cycle or pulse width to the modulated complementary pair of switching devices.

31. The system as recited in claim 28 further comprising:
an established second reference duty cycle or pulse width,
wherein the clock reference is adapted to initiate a single mode of power conversion operation when either of said duty cycles or pulse widths are equal to or substantially equal to the second reference duty cycle or pulse width.

32. The system as recited in claim 31, wherein the single mode of power conversion operation is buck mode or boost mode.

33. The system as recited in claim 31, wherein when the duty cycles or pulse widths generated using the first modulation ramp are equal to or substantially equal to the second reference duty cycle or pulse width, the system is adapted to transition to the single mode of power conversion corresponding to the first modulation ramp.

34. The system as recited in claim 33, wherein before the system transitions to the single mode of power conversion corresponding to the first modulation ramp, the clock reference is adapted to generate a plurality of fixed-width or fixed duty cycle pulses to the complementary pair of switching devices controlled by the second modulation ramp.

35. The system as recited in claim 31, wherein when the duty cycles or pulse widths generated using the second modulation ramp are equal to or substantially equal to the second reference duty cycle or pulse width, the system is adapted to transition to the single mode of power conversion corresponding to the second modulation ramp.

36. The system as recited in claim 35, wherein before the system transitions to the single mode of power conversion corresponding to the second modulation ramp, the clock reference is adapted to generate a plurality of fixed-width or fixed duty cycle pulses to the complementary pair of switching devices controlled by the first modulation ramp.

* * * * *